United States Patent [19]

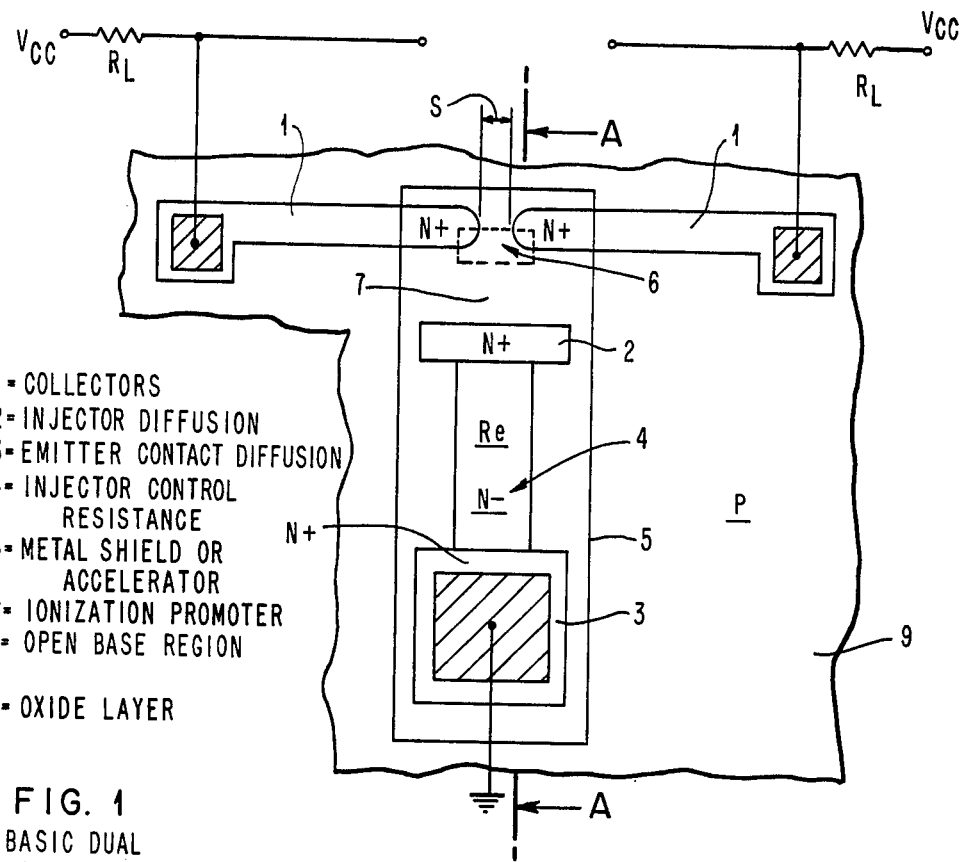
1 = COLLECTORS
2 = INJECTOR DIFFUSION
3 = EMITTER CONTACT DIFFUSION
4 = INJECTOR CONTROL RESISTANCE
5 = METAL SHIELD OR ACCELERATOR
6 = IONIZATION PROMOTER
7 = OPEN BASE REGION
8 = OXIDE LAYER
FIG. 1
BASIC DUAL COLLECTOR STRUCTURE
FIG. 2
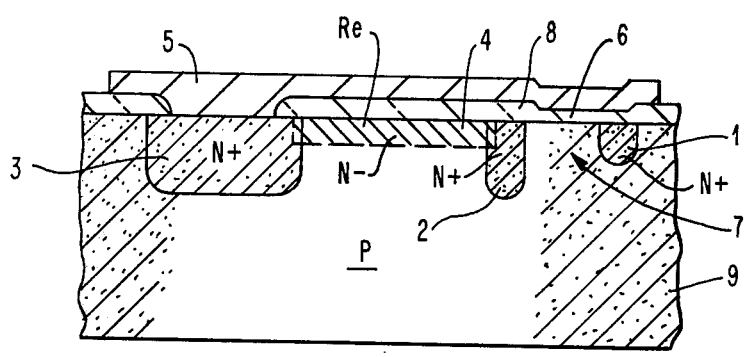

Vinal

[11] 4,288,708
[45] Sep. 8, 1981

[54] DIFFERENTIALLY MODULATED AVALANCHE AREA MAGNETICALLY SENSITIVE TRANSISTOR

[75] Inventor: Albert W. Vinal, Cary, N.C.

[73] Assignee: International Business Machines Corp., Armonk, N.Y.

[21] Appl. No.: 145,408

[22] Filed: May 1, 1980

[51] Int. Cl.³ .......................................... H01L 29/82
[52] U.S. Cl. .................................. 307/309; 357/13; 357/27; 357/35; 357/36
[58] Field of Search .................... 307/309; 357/27, 13, 357/35, 36

[56] References Cited

U.S. PATENT DOCUMENTS

| | | | |
|---|---|---|---|
| 3,714,559 | 1/1973 | Bate | 357/27 |
| 3,829,883 | 8/1974 | Bate | 357/27 |
| 4,129,880 | 12/1978 | Vinal | 357/27 |

FOREIGN PATENT DOCUMENTS 6983 1/1980 European Pat. Off. .............. 357/27

Primary Examiner—William D. Larkins
Attorney, Agent, or Firm—Edward H. Duffield

[57] ABSTRACT

A new semiconductive device for sensing uniaxial magnetic fields is described. The sensor is essentially a dual collector lateral bipolar transistor operated in the avalanche region. Each of the collectors exhibits two space charge resistance effects. One effect produces a negative resistance and the other produces a positive resistance. When the two space charge resistances are carefully balanced, a net zero collector resistance is achieved. A balanced condition can be maintained for a broad range of collector currents. A vertical VI property is thereby achieved. It has been found that the positive space charge resistance characteristic is inversely proportional to the ionization area and that the negative component is proportional to the area in the avalanche zone at each collector. It has been found that a magnetic field can modulate the ionization areas at the collector junctions. The area modulated results in modulation of the positive and negative space charge resistances at each collector and a resultant shift in the avalanche voltage occurs for each collector. A differential output may be obtained since the modulation effect operates oppositely on each of the collector junction areas. This mechanism accounts for the linear and differential magnetoresistive behavior of the device.

9 Claims, 31 Drawing Figures

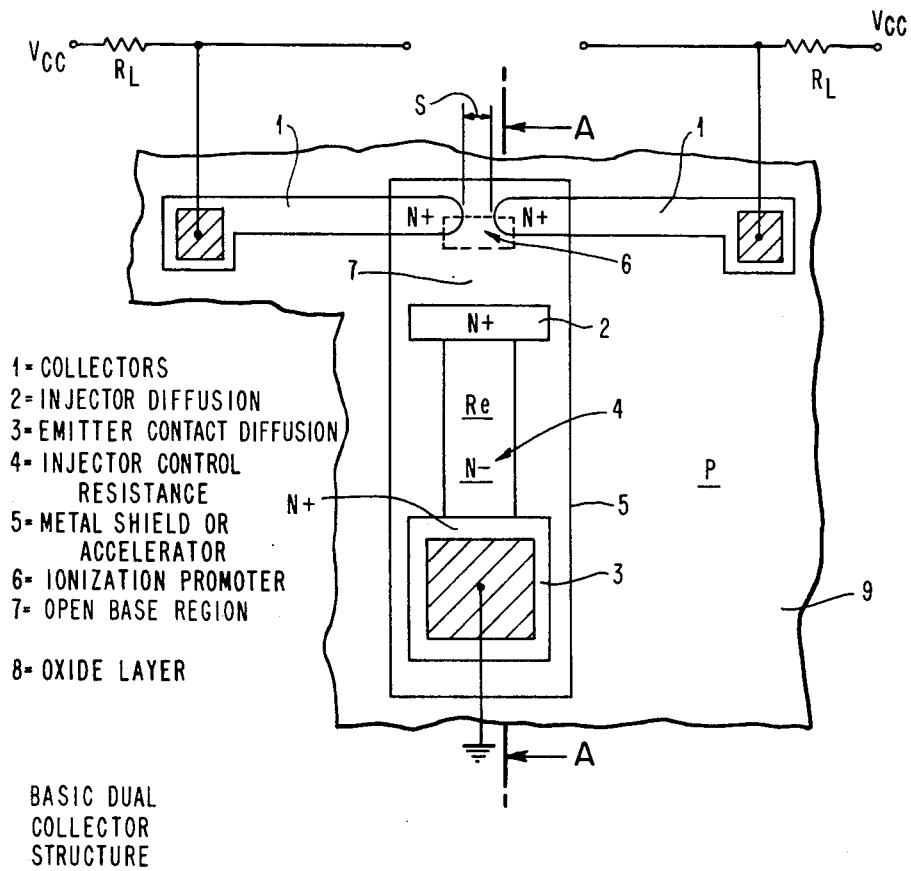

1 = COLLECTORS
2 = INJECTOR DIFFUSION
3 = EMITTER CONTACT DIFFUSION
4 = INJECTOR CONTROL RESISTANCE
5 = METAL SHIELD OR ACCELERATOR
6 = IONIZATION PROMOTER
7 = OPEN BASE REGION
8 = OXIDE LAYER

BASIC DUAL
COLLECTOR
STRUCTURE

B = 400 Sin(120πt) GAUSS
SIGNAL (COLLECTOR – COLLECTOR)

B = 0 GAUSS
(NOISE)

VOLT-AMP PROPERTY

SLIT FIELD GAIN VS SLIT WIDTH IN $\mu$METERS

AVALANCHE PROPERTIES OF
$P^+$ P $N^+$ STRUCTURE

P⁺ P N⁺ STRUCTURE

CHARGE

FIELD COMPONENTS

BASIC LATERAL STRUCTURE

VOLT-AMP CHARACTERISTICS VS
FIELD COMPONENTS

CHARGE ACCUMULATION DUE TO EXCESS MAJORITY CARRIER DECELERATION

SPACE-CHARGE FIELD COMPONENTS

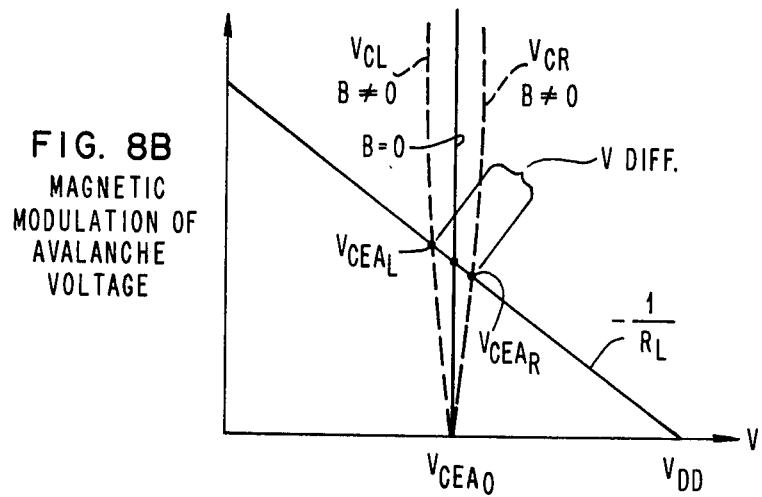
FIG. 8B
MAGNETIC MODULATION OF AVALANCHE VOLTAGE
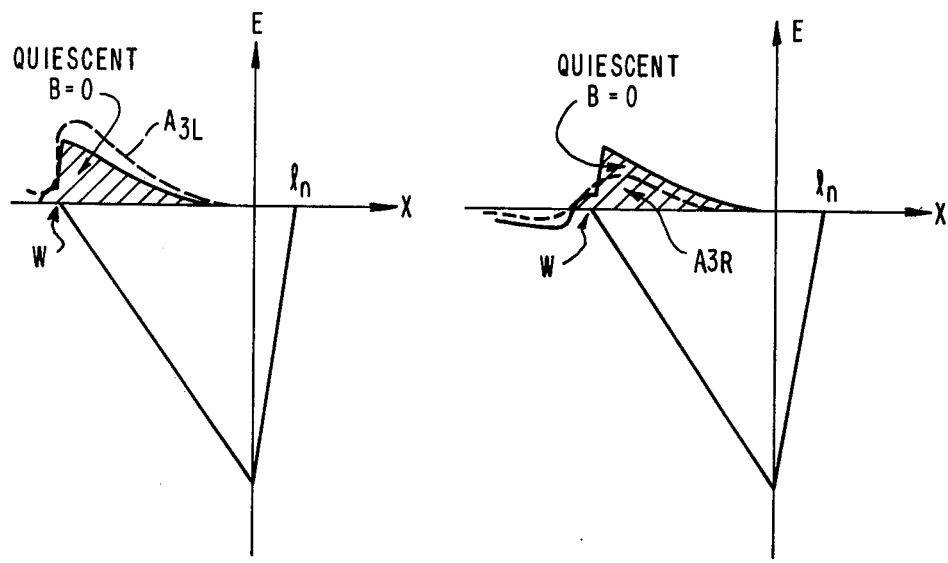
FIG. 8C
LEFT COLLECTOR
FIG. 8D
RIGHT COLLECTOR

EQUIVALENT CIRCUIT

SIGNAL & NOISE VS CURRENT

SIGNAL OUTPUT VS
MAGNETIC FLUX
DENSITY

VELOCITY-FIELD PROFILE

DECELERATION FIELD COMPONENT

DECELERATION FIELD VS CARRIER TYPE

DIFFERENTIALLY MODULATED AVALANCHE AREA MAGNETICALLY SENSITIVE TRANSISTOR

FIELD OF THE INVENTION

The invention relates to magnetic field sensitive devices in general and specifically to transistor or semiconductive structures which are magnetically sensitive.

PRIOR ART

For nearly one hundred years, solid state magnetic sensor technology has been limited to either the basic Hall or non-linear magneto resistive types of sensor. Both of these technologies possess fundamental limitations which are fairly well known in the art. For example, the Hall technology even when applied to semiconductors is limited in sensitivity to approximately 20 microvolts per gauss. Magneto resistive elements may exhibit an order of magnitude better sensitivity than Hall devices, but are generally characterized by being non-linear and in some cases, monodirectional in response. Both technologies require broad bandwidth linear high gain amplifiers for transforming their relatively small output signals to useful amplitudes. Unfortunately, the available signals may not be amplified to usable ranges without including random noise and other deleterious effects introduced by thermal or mechanical stress. These consequences have defeated many attempts to employ such sensors in specific applications.

As noted in my own copending application Ser. No. 924,489, assigned to a common assignee herewith, a variety of semiconductive magnetic sensors are known to exist but there are none of these (other than my own) which utilize an avalanche or impact ionization process to create a linear differential magnetoresistive sensor.

OBJECTS

In light of the foregoing limitations in the known prior art, it is an object of the present invention to provide an improved class of magnetically variable controlled avalanche voltage transistor devices which respond to a magnetic field to vary the avalanche voltage in a transistor device about a stable quiescent avalanche voltage point.

Yet another object of the present invention is to provide an improved semiconductive magnetic sensor device of the avalanche transistor type which does not exhibit a snap-back voltage characteristic as shown in my own prior copending application referenced above.

BRIEF DESCRIPTION OF THE DRAWINGS

FIG. 1 illustrates a plan view in schematic form of a lateral bipolar transistor structure embodied as a magnetic sensor according to the present invention.

FIG. 2 illustrates a partial cross sectional view taken along section line AA in FIG. 1 and showing the operative elements of the transistor as they are developed in the body of semiconductive material.

FIG. 8B is a current and voltage plot of the output obtained from a device as illustrated in FIG. 1 showing how the collector voltages vary from the static condition under the influence of a magnetic field.

FIG. 8C illustrates the electric field and avalanche area conditions in the zone in front of the left collector in FIG. 1.

FIG. 8D illustrates the electric field and avalanche area in the zone in front of the right collector in FIG. 1.

SUMMARY

Figure 3A:
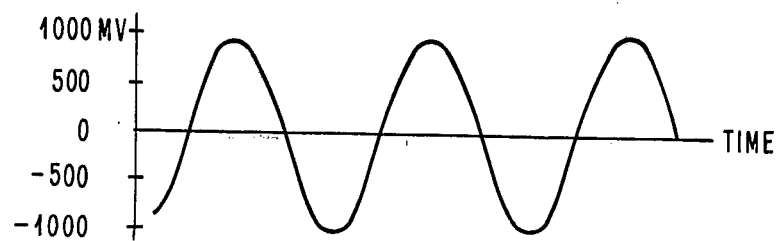
FIG. 3A illustrates a typical signal developed at the output terminals of a device as depicted in FIG. 1 when subjected to a sinusoidal 400 gauss magnetic field.

The basic semiconductor device presented herein is an improved version of that described in my aforementioned copending application Ser. No. 924,489. The improved sensor presented herein is basically another dual collector lateral bipolar transistor operating in the avalanche region. It is stabilized so that the avalanche voltage presents a vertical VI characteristic without a snap-back effect as shown in my previously mentioned application. A detailed study of the mode of operation involved in a bipolar transistor operating in the avalanche region has identified two simultaneously occurring mechanisms to account for the transistor behavior in this region. Two different collector space charge resistance mechanisms have been identified, one of which leads to a positive resistance and the other of which leads to a negative resistance component. The negative resistance component results when adequate avalanche carrier deceleration occurs within the space charge region in front of the collectors and excess carrier recombination occurs external to that region. It has been shown that optimum magnetic sensor behavior is achieved when the negative resistance mechanism is balanced by the positive resistance mecahnism within the space charge regions. A vertical VI property results which is stable. It occurs at the avalanche voltage $V_{CEA0}$. A differential output signal is obtained as the result of a magnetic input field by effectively pivoting the VI characteristic about the breakdown voltage.

An unusual feature of these devices in the present invention comprises a separate emitter contact region and a remote emitter diffusion acting as an injector for minority carriers. These regions are connected by a resistive region in contact with the body of semiconductive material. The distance between the emitter and the injector is preferably greater than the diffusion length of excess minority carriers in the base material. The extender region from the emitter to the injector has a carefully controlled internal resistance. The injection efficiency of the injector located at the end of the resistance region. The injector is thus positioned away from the emitter and is positioned closest to the collectors. It has its injection efficiency adjusted by the control resistance of the extender region connecting the emitter to the injector. By this means, a dynamic collector impedance for the device is maintained near zero value independent of the avalanche collector current. In such a structure, the magnetic sensitivity measured in millivolts per gauss is found to be almost exactly proportional to the substrate resistivity. The output signal is measured between dual collectors and is differential in character.

The device responds linearly to magnetic field inputs and is bipolar in that it responds to either polarity input field. Typical signal to noise ratios to two per gauss per megahertz have been noted and the bandwidth has been measured to extend well beyond five megahertz. It is believed that the basic frequency mechanism is limited by depletion and stray capacity and transit time effects. Preliminary investigation of these effects suggest a potential of $10^9$ Hz capability.

DETAILED SPECIFICATION

FIGS. 1 and 2 illustrate, respectively, a plan view and a longitudinal cross sectional view of a preferred form of the present invention. As noted above, the device is essentially an open base lateral bipolar transistor which is operated stably in the avalanche region. In accomplishing stabilization of the device, and in achieving the high magnetic output, seven basic structural elements are used.

Two collectors 1 are shown spaced apart from one another in the base material by a narrow distance called slit S. The slit width S is typically $2\frac{1}{2}$ micro meters. The height and depth of the collector regions (height being measured longitudinally in the vertical direction on FIG. 1 and depth being in and out of the plane of the paper in FIG. 1) are such that the collector 1 regions are designed to allow the tips of the collectors which face one another to have a radius of curvature of approximately $1\frac{1}{4}$ micro meters.

A minority carrier injector region 2 is disposed between the collectors 1 and an emitter contact region 3. The depth of injector region 2 is approximately 2 micro meters and is similar in depth and in doping concentration to the emitter and collector diffusions 3 and 1 respectively.

A highly important feature in maintaining stable avalanche conditions connects the emitter contact area 3 to the injector 2. This injector to emitter connection has a controlled resistance and is shown as connector 4 connecting region 3 to region 2 and lying within the surface of the substrate material 9. Region 4 is relatively shallow (typically 1 micro meter) and is usually ionically implanted followed by a drive in diffusion heating to obtain precise control over its resistance.

A metal shield or carrier accelerator is shown overlying a portion of the collectors 1, the injector 2 and the resistive connection 4. It is connected to and forms an integral part of the emitter contact 3. This region of metalization is identified by numeral 5 in FIGS. 1 and 2. It is shown in FIG. 1 in position above the components which underlie it. From this, in conjuction with FIG. 2, it may be understood that the metal layer 5 is insulated from the surface of the semiconductor substrate 9 by an oxide region 8. The oxide region 8 is approximately 6,000 Angstrom units thick except for a region which is thinner. The thinner region is shown overlying the region 6 near the end faces of the collectors 1 which face towards the injector 2. In this region the oxide may be approximately 1,000 Angstrom units thick. As described in my previously mentioned copending application, this thin oxide "window" increases the electric field intensity in the region of the base to collector junction faces on each of the collectors to promote impact ionization in avalanche. The metal electrode or shield 5 is connected to ground and the collectors 1 are connected through resistors $R_L$ to an appropriate voltage to create an intense electric field in the region where the oxide layer 8 has been thinned as shown as area 6 in the figures.

A carrier transportation and recombination zone 7 is illustrated lying between the end face of injector 2 and the approximate end of the space charge region which will extend from the collectors 1. The length of this region 7 is made to be approximately equal to the excess majority carrier diffusion length (typically 22 micro meters for holes) for the type of substrate material chosen.

Conventional LSI manufacturing processes and techniques are used for fabricating the stable avalanche transistors illustrated in the figures. Typically, the starting silicon wafers are of P-type silicon with a (100) orientation. After the wafers have been cleaned, a 200 nanometer oxide layer is grown on the surface for masking purposes. It is grown utilizing a high temperature steam oxidation process well known in the art. Standard photo resist materials are then applied and exposure and etching steps using appropriate masks follow to generate the areas where the three separate diffusions for the collectors and the emitter and injector are desired.

Doping of the various regions of the device may be carried out by ion implantation or by diffusion. Usually ion implantation followed by a heating step for diffusion is recommended. The emitter region 3, the injector 2, and the collectors 1 exclusive of the collector tips were formed in preferred embodiments shown in FIGS. 1 and 2 by a first diffusion of phosphorus to create N+ doping. Subsequently, a combined drive in and oxidation step is carried out in steam to create an oxide layer of 700 to 800 nanometers thickness over the substrate 9 and to diffuse the regions evenly and to grow an oxide layer over the diffusion areas. The resistivity of the resulting diffusion is approximately 10 ohms per square. The same masking and etching techniques are used to define the second and third diffusion regions used for developing the resistive connection 4 and the tips of the collectors 1.

After appropriate photo resist and exposure steps with appropriate masks, etching is carried out to re-expose the surface of substrate 9 and phosphorus is implanted to the appropriate depth in the region illustrated as the connective resistor 4. A drive in and reoxidation step follows. Another resist and exposure step followed by etching to expose the tips of collectors 1 is then carried out. Then the tips of the collectors are defined by an ion implantation process. After this final implantation, a reoxidation step to drive it in and form a final diffusion is carried out and then a clean thermal oxide is regrown over the ionization promoter region 6 to the desired depth (approximately 1,000 Angstrom units).

Finally, contact areas for the emitter contact and the two collectors are opened by etching. Then metal, typically aluminum, is evaporatively deposited over the surface of the oxide layer 8 and making contact with the emitter region 3 and collector regions 1 in an appropriate shape electrically isolating the contacts from one another. Interconnections may be formed to other devices on a wafer or leads may be bonded to the contact areas for external connection to the resulting chip.

More than 2,000 of these dual collector magnetic sensor configurations of stable avalanche transistors have been built and examined. Most of the devices examined are created to have a preferred static volt amp characteristic as shown in FIG. 3C. A typical V-I characteristic is shown in FIG. 3C and is obtained from a curve tracer connected to the device with both collectors 1 shorted together and by grounding the emitter contact 3. The V-I characteristic that is preferred exhibits an approximately zero dynamic impedance while operating in the avalanche region. The device is stable under these conditions and does not exhibit the negative resistance or snap-back effects when it has been appropriately designed to include the resistive connector region 4 and the injector 2 described herein. Avalanche breakdown voltage for a typical 5 ohm centimeter P-type substrate with approximately 1,000 Angstrom units thick ionization promotion area 6 occurs at approximately 28 volts.

Figure 3B:
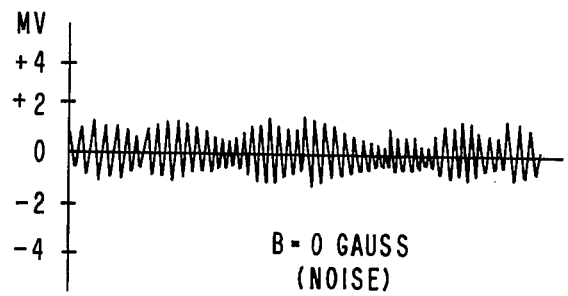
FIG. 3B illustrates the noise components of the output signal without a magnetic field input in a device as depicted in FIG. 1.
Figure 3C:
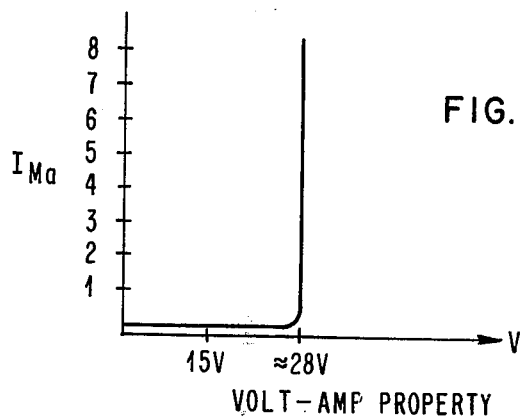
FIG. 3C illustrates the stabilized volt amp property of a collector to emitter voltage at avalanche in the structure as depicted in FIG. 1.

FIGS. 3A and 3B are representations of photographs of signal and noise measurements obtained from typical test devices. An applied magnetic field of 400 sin $(120\pi\tau)$ gauss was used to induce the response shown in FIG. 3A. The time varying output of the device is measured as a differential voltage between the two collectors 1. A sensitivity of approximately 3 millivolts per gauss is typical for 5 ohms centimeter P-type material.

A signal to noise ratio measured for typical test devices of this invention is approximately two per gauss per megahertz given a substrate resistivity of 5 ohm centimeters. A bandwidth of 1 megahertz is used for purposes of standardization and the signal to noise ratio characteristic of devices using the thin oxide layer in the promoter region have been observed. This spectral property of the noise has been measured. An inverse frequency characteristic was observed extending from zero hertz to 35 megahertz. This noise spectrum was not studied beyond 35 megahertz since the high frequency components are limited by stray capacitance within the test fixtures. The frequency response of typical devices has also been examined and the response to low level pulsed magnetic fields has been measured. A 30 turn coil wound on a 0.65 centimeter diameter ferrite core was energized by a 500 milliamp current pulse with a 200 nanosecond rise time. All devices measured reproduce the current pulse characteristics of the driving input source. This result suggests that the device has frequency capabilities considerably in excess of the 5 megahertz demonstrated by this test.

DETAILED CONSIDERATIONS

As mentioned previously, both positive and negative space charge resistance phenomena have been discovered as operative in this device. It has been found most desirable and necessary for stable avalanche operation that the positive and negative space charge resistance characteristics be compensated so as to balance one another and maintain a vertical VI characteristic as shown in FIG. 3C.

Figure 5A:
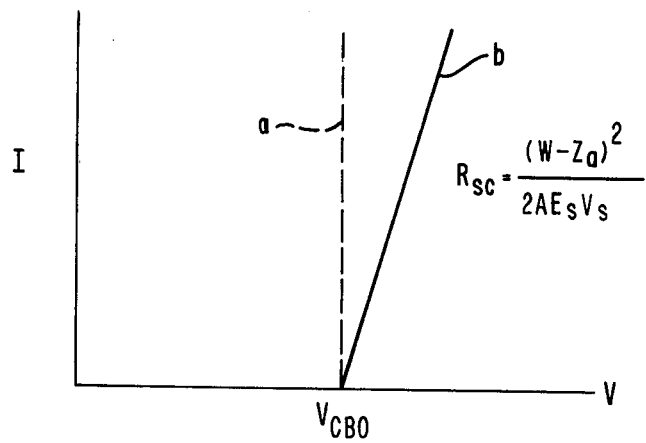
FIG. 5A illustrates the avalanche voltage characteristic of a typical P+ PN+ diode structure.
Figure 5B:
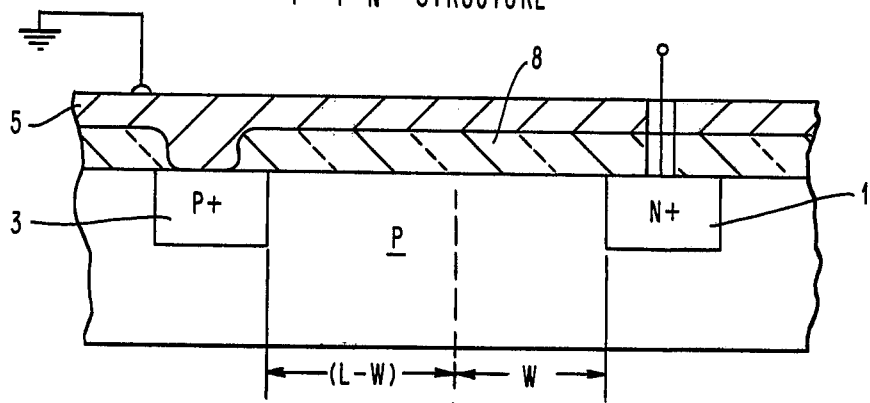
FIG. 5B illustrates a cross sectional schematic view of a lateral bipolar P+ PN+ diode structure to be used in conjunction with FIGS. 5A, 5C and 5D.
Figure 5C:
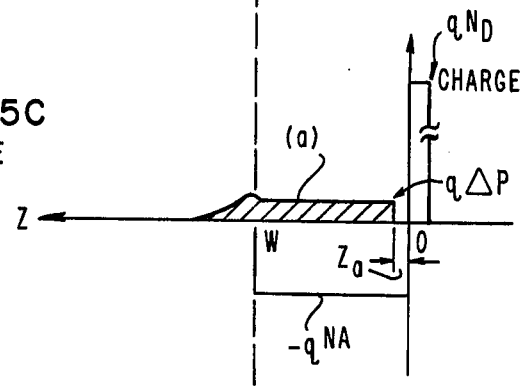
FIG. 5C illustrates the space charge distribution in the vicinity of the collector P-N junction corresponding to the semiconductive device as shown in FIG. 5B.

For investigating the nature of the positive space charge resistance mechanism, consider the lateral P+ PN+ structure illustrated in cross section in FIG. 5B. The emitter 3 in this simple example consists of an ohmic contact made to a P+ region diffused within P-type substrate material. The avalanche properties of this structure exhibit a characteristic positive slope as illustrated by curve b in FIG. 5A. No magnetic responsiveness has been observed from this diode structure. It should be noted that this is not the avalanche transistor of the present invention but is utilized for illustrative purposes to discuss the positive space charge resistance phenomenon. FIG. 5C illustrates the charge distribution generally occurring around the stochastic boundary at the base to collector junction in FIG. 5B. FIG.

5D illustrates the electric field which occurs within the space charge region characteristic of this type of structure.

Excess holes are created by impact ionization once appropriate voltage levels between the emitter and the collector have been applied. These excess holes have a charge density of $q\Delta P$ and the holes traverse the space charge region and give rise to a triangularly contoured electric field component plot illustrated as curve a of FIG. 5D. This field component subtracts from that produced by ionized acceptor atoms in the substrate material. As a consequence, the length W of the space charge region will grow in proportion to the area under the curve a in such a way that the electric field at the PN junction between the base and the collector is maintained at the ionizing field strength. The growth in length W is given as $\Delta W$ and describes the growth of the space charge region which gives rise to a positive slope in the VI properties of such a device as illustrated by the curve b in FIG. 5A. The equivalent space charge resistance $R_{SC}$ and the growth $\Delta W$ of the depletion layer length for this configuration are given by the following formulas:

$$R_{SC} = \frac{(W_o - Z_a)^2}{2 A_A \epsilon_S V_S} \quad (1A)$$

$$W = W_o \left( \frac{\Delta P}{N_A - \Delta P} \right) \quad (1B)$$

where:

$N_a \times$ the acceptor concentration of the substrate material.

$W_o$ = the length of the space charge region at the threshold of ionization.

$Z_a$ = the length of the avalanche region measured laterally in front of the face of the collector 1 in the direction of the emitter 3.

$V_S$ = the saturation carrier velocity.

$\epsilon_S$ = the dielectric constant for silicon.

$A_A$ = the cross sectional area of the avalanched region at the face of the base to collector junction.

$\Delta P$ = is the concentration of majority carriers generated by ionization.

Assuming that the avalanche interval $Z_a$ is much, much shorter than the length of the space charge region W given by equation 2 below can be substituted into the expression 1A above.

The depletion width W is given by the following:

$$W_o = \left( \frac{2 \epsilon_s}{q} (\psi_o - V) \frac{N_A + N_D}{N_A N_D} \right)^{\frac{1}{2}} \quad \text{Eq. (2)}$$

Substituting the expression for $W_o$ into Eq. (1A) yields the following:

$$R_{sc} = \frac{V_{CEA_o}}{q N_A A_A V_s} \quad \text{Eq. (3)}$$

From the above expression (3), it may be seen that the effective positive space charge resistance is proportional to the initial breakdown voltage and inversely proportional to the acceptor concentration appearing in the P-type substrate region and to the avalanche area $A_A$ among other factors. The voltage $V_{CEA_o}$ is defined to be the avalanched collector to emitter avalanche voltage.

A negative space charge resistance effect also exists. While no static negative resistance characteristic can be measured for a P+ PN+ structure such as shown in FIG. 5B, the phenomenon may nevertheless be characterized. The reason that the static negative resistance characteristic for the structure as shown in FIG. 5B cannot be measured is that the P+ region allows essentially all of the excess minority carriers to escape into the transportation and recombination region 7 such as shown in FIG. 1. This region is indicated by the region L-W in FIG. 5B. The result is that a majority of the recombination occurs with excess holes as they exit from the collector space charge region. Under these circumstances little excess carrier accumulation can occur at the end of the space charge region. The recombination process occurring there constitutes the major factor supporting the current continuity.

Under different circumstances described below, majority carrier deceleration can occur within the depletion layer. This requires a corresponding increase in carrier density in order to maintain continuity of the avalanche current density. This type of charge accumulation is illustrated in FIG. 6B and produces an electric field component at the end of the depletion layer as shown by the chart in FIG. 6C. This electric field component opposes a portion of the space charge field component due to the ionized acceptors. However, at the collector to base PN junction, the value of this accumulated electric field component is small and therefore has little effect on the field required there to support ionization.

An increase in excess carrier density at the end of the collector depletion region is permitted to occur as a result of shifting the recombination mechanism zone closer to the emitter than to the collector. This condition can be created if the P+ region in FIG. 5B is replaced by an N+ region, thus forming a PN junction at the emitter end of the structure. This configuration forms the lateral transistor illustrated in FIG. 6A for the basis of these discussions.

Figure 6A:
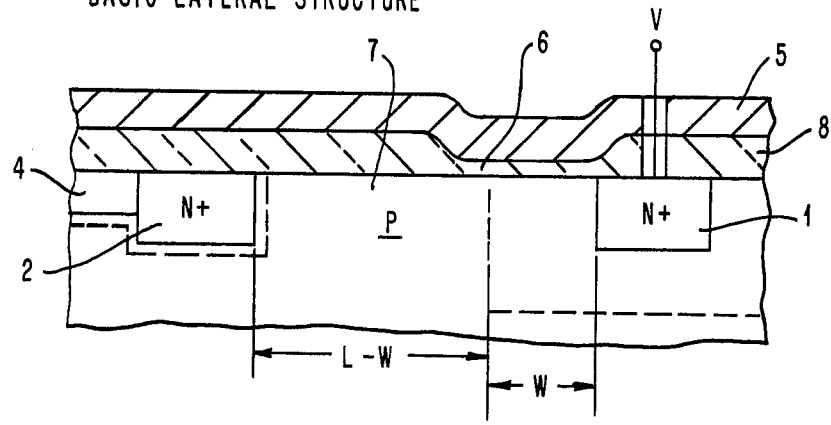
FIG. 6A illustrates a horizontal cross section through an NPN structure of the basic lateral bipolar transistor.

In FIG. 6A, the length of the transportation and recombination zone L-W as used in experimental devices was approximately equal to the excess majority carrier diffusion length. The bipolar properties of the transistor configuration shown in FIG. 6A can be shown to be poor with poor being defined as a bipolar gain $\beta$ typically less than 1 when operated below the avalanche potential.

Figure 6D:
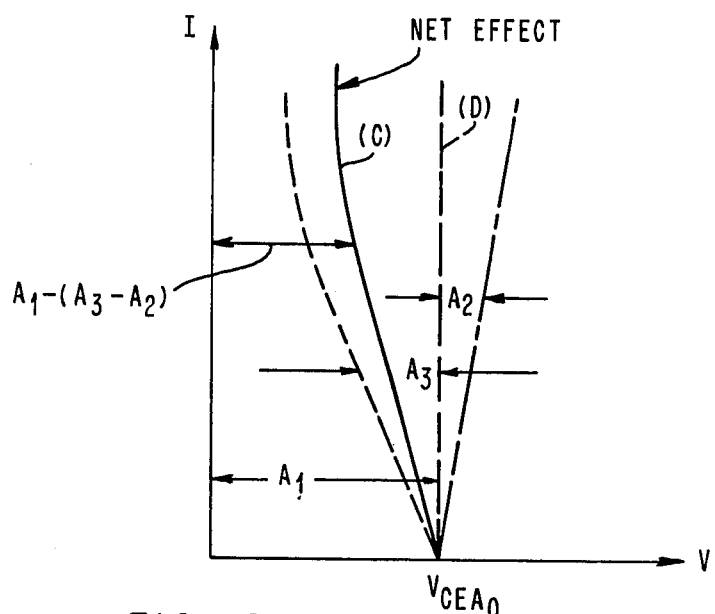
FIG. 6D illustrates typical volt amp characteristics versus field component effects for the collector to base avalanche voltage breakdown condition for a device as illustrated in FIG. 6A.
Figure 6B:
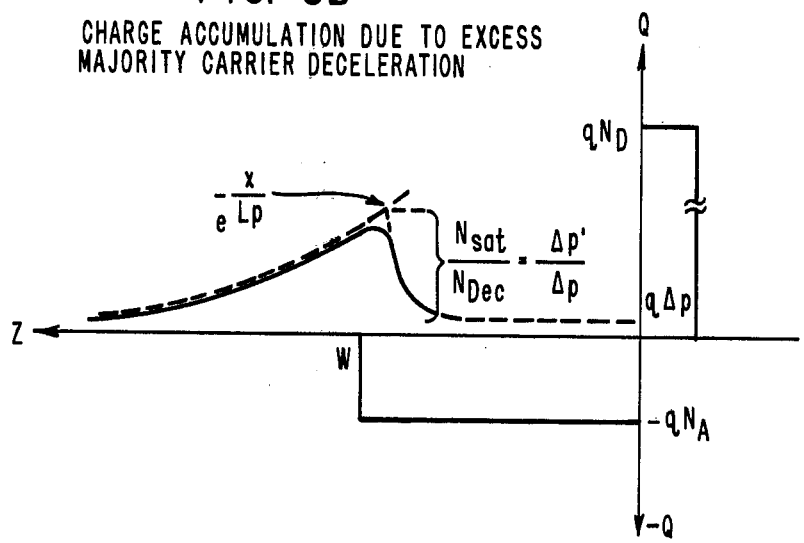
FIG. 6B illustrates the charge accumulation effects in the interval in front of the collector diffusion of the device as illustrated in FIG. 6A.
Figure 6C:
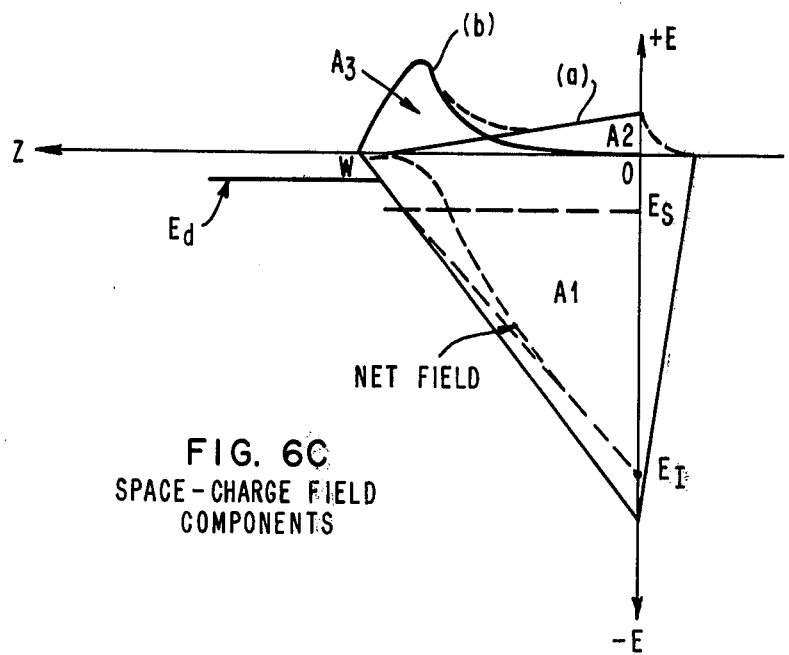
FIG. 6C illustrates the space charge electric field components in the vicinity of the collector P-N junction of the structure as shown in FIG. 6A.

FIGS. 6B through 6D illustrate events taking place at the end of the collector depletion layer given the lateral transistor configuration shown in FIG. 6A. FIG. 6B illustrates the majority carrier accumulation as the avalanche produced carriers decelerate within the space charge region. The incremental distance at the end of the space charge region where accumulation occurs, is quite short compared to the diffusion length $L_d$. At a distance from the collector beyond the peak density accumulation, the majority carriers recombine with injected excess minority carriers. A finite majority carrier density (holes for P-type material) is required adjacent to the emitter junction in order to forward bias that junction.

FIG. 6C illustrates the electric field components within the collector space charge region due to majority carriers moving at saturation velocity (curve A) and those accumulating at the end of the region (curve B).

Figure 5D:
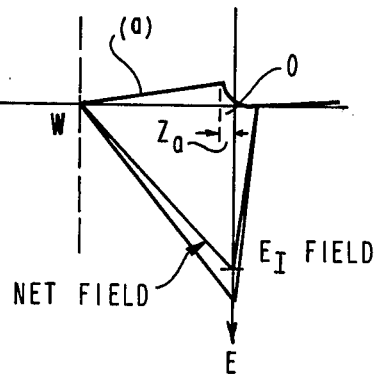
FIG. 5D illustrates the electric field components in the vicinity of the collector P-N junction corresponding to the semiconductive device shown in FIG. 5B.

The increase ΔW in the length of the depletion region due to the field component in curve A was already discussed with reference to FIG. 5B and FIG. 5D. The field component B in FIG. 6C is quite small at the collector base PN junction and does little to modify the field needed at the PN junction to sustain ionization. However, the area $A_3$ contained under curve B in FIG. 6C is typically greater than the area $A_2$ and will subtract from the area of the sum $A_1+A_2$ in such a way that the net collector potential required to sustain ionization may be less at a given current than the initial breakdown voltage $V_{CEA_O}$. This negative resistance effect is illustrated in FIG. 6D. The solid curve C in FIG. 6D illustrates the net effect of all field components within the space charge region.

An increase in the recombination rate appears to occur at the end of the collector space charge region as the emitter injection efficiency changes. This effect is illustrated in FIG. 6D by the change in the slope of the VI curve C with increasing current. Injection efficiency can be controlled external to the device at any current level by adjusting the value of a resistor connected between the emitter and the substrate (base). However, there is no single value of a resistance shunt which for all currents will produce a vertical VI property. Non-linear injection efficiency effects are undesirable and are minimized in the present invention by the use of a separate injector region in the base which is coupled to the emitter contact by a resistive region of a known controlled internal resistance as shown in FIGS. 1 and 2. The object of the controlled injector resistance is twofold.

First, the injector to emitter connector has a controlled resistance in region 4 to provide a means to allow the product M·α to linearly increase throughout a broad range of collector current. Secondly, adjusting the magnitude of the resistance in region 4 provides a means for shifting the excess carrier recombination region area away from the edge of the collector space charge region. This shift allows carrier deceleration effects to be used and to achieve the desired negative collector resistance needed to obtain a net vertical VI avalanche property illustrated by curve D in FIG. 6D.

By adjusting the resistance connecting the emitter to the injector in this manner, the device may be compensated to create a stable avalanche transistor with a vertical VI property throughout a substantial current range. The resistance needed to compensate a lateral transistor structure as shown in FIG. 2 will vary as a function of the substrate resistivity and the length L-W of the transportation and recombination zone. This controlled resistance for region 4 as defined for FIGS. 1 and 2 has been measured experimentally for a wide range of substrate resistivities and devices. The results are given as the chart or curve in FIG. 7 where the resistance of the connection 4 between the emitter and the injector has been measured for compensating lateral NPN structures as a function of the P-type substrate resistivity given a drift length of approximately $2\times10^{-3}$ centimeters.

Figure 7:
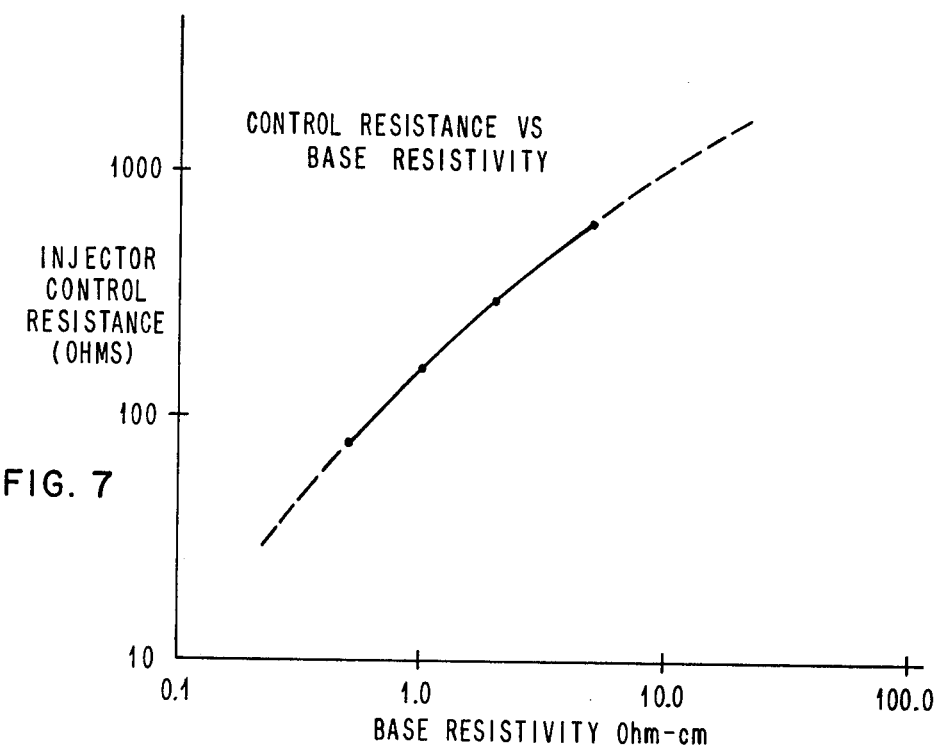
FIG. 7 illustrates a specification for the preferred injector to emitter control resistance as a function of substrate resistivity for embodiments of the invention.

As illustrated in the FIG. 7, the compensation resistance needed in region 4 as shown in FIGS. 1 and 2 increases with substrate resistivity.

Figure 13A:
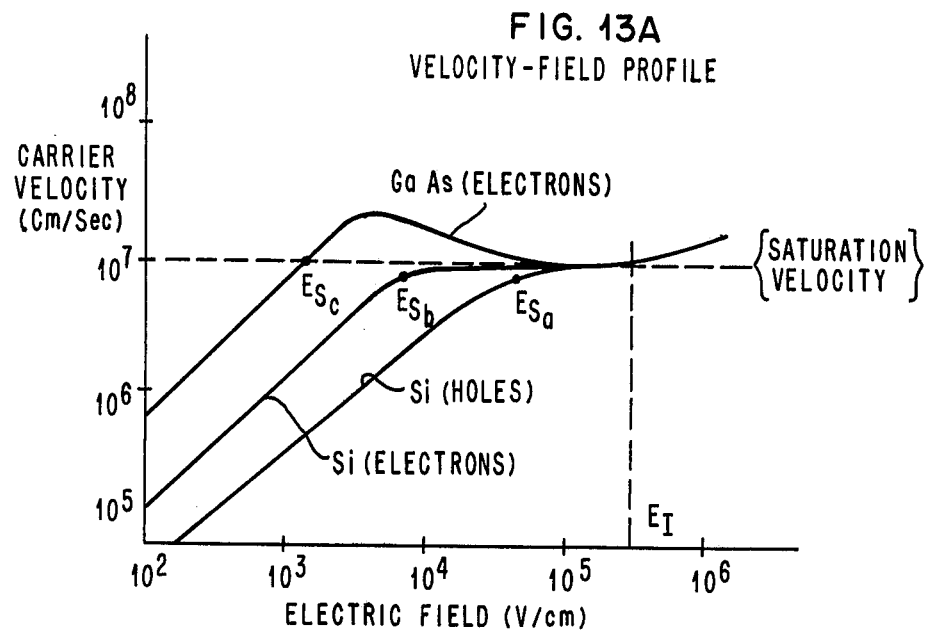
FIG. 13A illustrates a chart of electron and hole velocity versus electric field strength for silicon and for gallium arsenide.
Figure 13B:
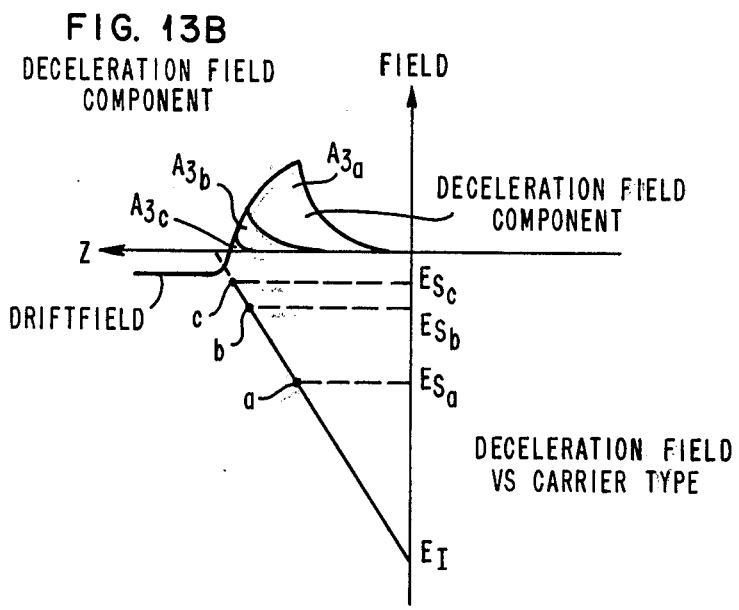
FIG. 13B illustrates the carrier deceleration field component as a function of distance from a stochastic junction for various carrier types.

The majority carrier deceleration and the accumulation mechanisms just described above which occur at the end of the space charge region give rise to the negative resistance effect. The behavior of the majority carrier velocity profile as a function of electric field plays a dominant role in determining the effect of the negative space charge resistance characteristic. FIG. 13A is a typical chart of carrier velocity versus electric field strength for holes and electrons within silicon and electrons within gallium arsenide. It is evident that the field required to maintain saturation velocity of holes in silicon is quite high compared to the saturation velocity field for electrons within either silicon or gallium arsenide. Consequently, hole deceleration will begin within the space charge region at a distance relatively close to the collector base PN junction. Area $A_{3a}$ in FIG. 13B suggests that the electric field component is due to holes in silicon being decelerated. In contrast, the electric field $A_{3b}$ due to electron deceleration effects within silicon is considerably less since deceleration occurs much closer to the end of the space charge region. In further contrast, electrons within gallium arsenide are actually accelerated for a substantial distance within the space charge region as a result of the direct band gap nature of this material. Electron deceleration within gallium arsenide occurs very close to the end of the space charge region and consequently, these carriers may enter the transport and recombination zone without creating any significant deceleration field effect.

The magnetic sensitivity of NPN dual collector silicon devices of the type illustrated in FIGS. 1 and 2 has experimentally been found to be at least an order of magnitude greater than silicon PNP devices. The negative resistance effect was not observed in the lateral PNP configurations examined which used the range of physical parameters examined for NPN structures. The result suggests that the deceleration field effects of electron carriers in silicon is incapable of totally overcoming the positive space charge resistance defined in equation (1). The experimental results given agrees with the prediction that can be made by comparing the deceleration profiles of the holes versus electrons in silicon.

Returning now to a discussion of the dual collector structure of the preferred embodiments of the invention, the analysis will focus upon the events taking place in the vicinity of the dual collector base junctions.

FIGS. 8C-8D illustrate the typical situations described with respect to the single PN junction analysis given above. However, they will indicate the effects where the two collector regions in the present invention are in close proximity to one another. This will be seen below.

Returning briefly to FIG. 1, the potential $V_j$ of the injector 2 is proportional to the sum of the individual injector to collector currents and to the resistance $R_e$ of the emitter to injector connection formed in the substrate in region 4. The result is given by equation (4) below.

$$V_j = K(I_{C1}+I_{C2})R_e \qquad \text{Eq. (4)}$$

The unusual structural feature of dual collectors spaced close to one another in combination with a separate injector 2 and the controlled resistive connection between the emitter contacts 3 and the injector 2 maintains a constant emitter injection. This injection is maintained independently of any induced differential currents. The injector to emitter connection resistance $R_e$ is required to compensate the dual collector structure and is the same value as that required for a single collector device, exhibiting the same total avalanche area as the two collectors.

Figure 8A:
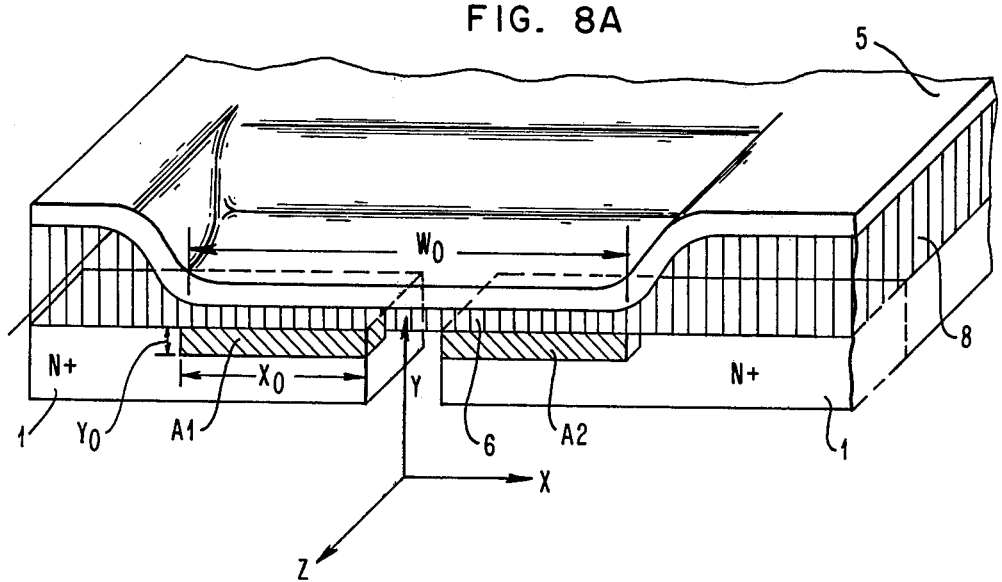
FIG. 8A illustrates a partial cross sectional view taken through the collector base stochastic junction area in a dual collector transistor structure as shown in FIG. 1 during avalanche.

Thus, the proper value for compensating structure as shown in FIG. 8A is the same as that plotted in FIG. 7 as a function of substrate resistivity. It is to be assumed in the following discussion that an appropriate resistance $R_e$ has been chosen for proper device compensation, i.e., a vertical VI characteristic so that the central VI curve given in FIG. 8B corresponds to the quiescent zero magnetic field situation.

The corresponding electric field components due to carrier deceleration fields are shown cross hatched in FIGS. 8C and 8D. If a magnetic field is introduced into the ionization volume of material at each collector base junction and with an orientation normal to the semiconductor surface, a Lorentz force will act upon the carriers tranversing the depth of the ionization region. This action will cause a shift in the ionization area at each collector.

Figure 9:
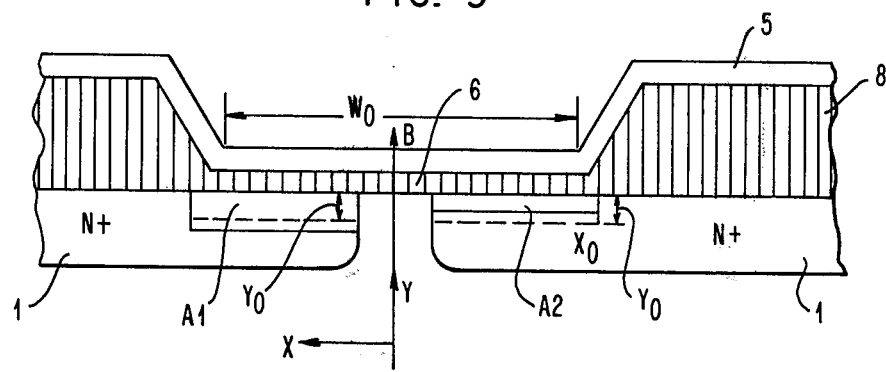
FIG. 9 illustrates a schematic representation of the avalanche area modulation effects of a magnetic field on the device as shown in FIG. 1 taken in cross section across the face of the collector base stochastic junctions.

The Lorentz force per unit field is a maximum since the carriers in this region are moving at or near the maximum permissible average velocity. This is typically a scatter limited saturation velocity of approximately $10^7$ centimeters per second. Given a magnetic field B oriented perpendicular to the surface of the semiconductor or directed up out of the semiconductor surface in FIG. 8A, the Lorentz force acts to increase the ionization area of the left collector in FIG. 8A and to diminish the ionization area of the right collector. The potential area $A_1$ at the left collector is thereby increased while the corresponding potential area $A_2$ at the right collector is decreased. Since the injector potential is constant, the potential of the left collector decreases relative to ground while the potential of the right collector increases. If the polarity of the magnetic field is reversed, the opposite situation to that just depicted occurs within these regions. Thus it may be seen, as will be described in detail below, that magnetic modulation of the area of avalanche occurring at the base collector junction region is the basic magnetic transduction mechanism for devices of the present type. These will be described further with reference to FIG. 9 after the following general observations are made. In the final analysis, modulating ionization area at each collector produces a linear and differential magnetoresistive effect.

Figure 4:
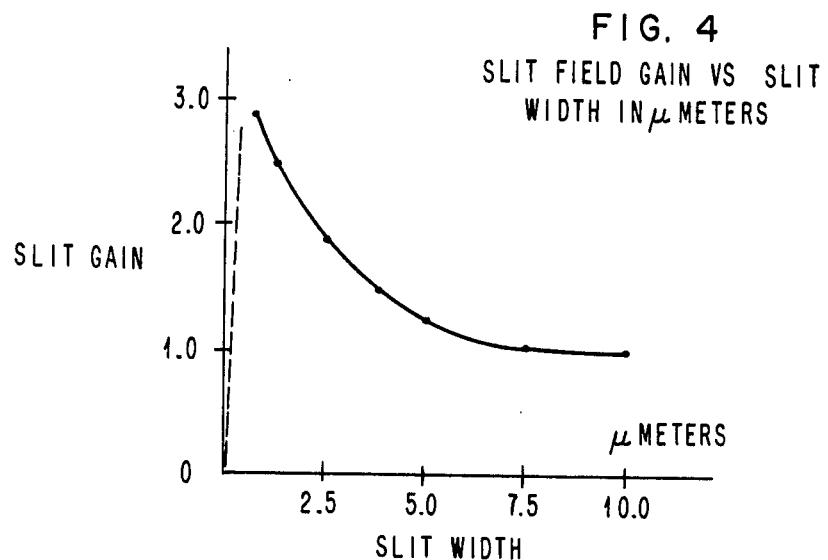
FIG. 4 illustrates a signal gain factor associated with the separation distance between the dual collectors as depicted in FIG. 1.

The potential difference created between the collectors 1 produces an electric field in the vicinity of the slit S as shown in FIG. 1. The polarity of the slit field which thus occurs will amplify the Lorentz action in the magnetic field. The width of the slit S influences magnetic sensitivity for these reasons. For a given applied magnetic field, the output signal will increase as the slit width is decreased. The dependency of output signal on slit width has been experimentally measured and defined for a variety of devices of this type. A general slit field output signal gain is depicted in FIG. 4. In FIG. 4 a plot of the slit field gain versus slit width in micrometers has been obtained from a series of experiments designed to investigate the effects of slit width on device output. A gain factor as large as three has been observed from test series.

MAGNETIC TRANSDUCTION

Mechanism

The following analysis is given for determining the basic magnetic transduction mechanism for dual collector avalanche transistor magnetic sensors. In particular, an expression is developed which will define the differential magnetic response signal voltage in terms of the amplitude of an applied magnetic field for a variety of critical device parameters.

FIG. 8A is a cross-sectional view of collector diffusions 1 taken across the collector to base junction between the base and the faces of the collector diffusions which face the injector 2 (not shown in FIG. 8A).

Areas $A_1$ and $A_2$ illustrate the regions where impact ionization is forced to occur. These regions are at the stochastic boundary between the collector diffusions and the base region. The length that the ionization progresses into the area in front of the collectors is defined as the Z axis and is defined as $Z_a$.

The energy density $W_{ea}$ of the A directed electric field within the ionization volume of material is given as the following:

$$W_{ea} = \tfrac{1}{2}\epsilon_s E_z^2(x, y, z) \qquad \text{Eq. (5)}$$

Wherein: $E_z(x, y, z)$ is the z directed electric field within the ionization volume.

The total energy developed within the volume where impact ionization occurs is obtained by taking the volume integral of equation (5). This is shown as equation (6) below.

$$W_{eA} = \tfrac{1}{2}\epsilon_s \int_0^{y_o} \int_0^{y_\bullet} \int_0^{Z_a} E_z^2(x, y, z)\, dx\, dy\, dz \qquad \text{Eq. (6)}$$

The length $Z_a$ to which the ionization interval extends is on the order of 100 Angstrom units and is much less than the length W of the depletion layer within the base region. Given this circumstance, the volume integral in equation (6) can be simplified as shown below in equation (7).

$$W_{eA} = \tfrac{1}{2}\epsilon_s Z_a \int_0^{X_o} \int_0^{Y_o} E_z^2(x, y)\, dx\, dy \qquad \text{Eq. (7)}$$

In general, the Z directed electric field is a function of the field in the y direction which is created by the ionization promoter field maintained between the metallization 5 through the thin oxide area 6 and the collector diffusions. It is not a function of the X dimension within the width $W_o$ of the thin oxide region 6.

Introducing a magnetic field component B into the ionization volume of material will create a Lorentz force with a direction given by the cross product of velocity of the carrier and the magnetic vector for carriers traversing the ionization region. For example, if a magnetic field is introduced parallel to the Y coordinate shown in FIG. 8A, an X directed Lorentz force will be realized. If a magnetic field is directed parallel to the X direction in FIG. 8A, a Y directed Lorentz force will be created. In both of these examples, carrier velocity and current is assumed to be directed parallel with the Z coordinate.

The magnetic transduction mechanism can be determined by equating the appropriate generation force component within the ionization region to a total Lorentz restraining force component also within the ionization region. It is apparent that there must be a restraining force or the carriers would move indefinitely in the X direction. The X and Y directed force components that must thus exist can be obtained by taking the derivative of equation (7) with respect to the $X_o$ and $Y_o$ conditions which correspond, respectively, to the X and Y dimensions of the impact ionization area occurring on the face of the collectors without the presence of a magnetic field. These are given by equations (8) and (9) below.

$$F_X = \frac{dW_{eA}}{dX_o} = \tfrac{1}{2}\epsilon_s Z_a \int_0^{Y_o} E_z^2(x_o, y)\, dy \qquad \text{Eq. (8)}$$

$$F_Y = \frac{dW_{eA}}{dY_o} = \tfrac{1}{2}\epsilon_s Z_a \int_0^{X_o} E_z^2(x, y_o)\, dX \qquad \text{Eq. (9)}$$

The device sensitivity to Y directed magnetic fields is considered next.

First it is necessary to obtain an expression for a Z directed electric field which produces the ionization condition. There are two principle field components which create the ionization field. One field component is that produced by the PN junction between the base and the collectors. The second field component is the electric field at the collector junction due to the potential difference between the collector diffusions 1 and the grounded overlying acceleration electrode 5 through the thin oxide region 6. A total field is produced by the sum of these two fields and is given by equation (10) below.

$$\epsilon_z(x, y, z) = \epsilon_{zj}(x, y, z) + \epsilon_{zox}(x, y, z) \qquad \text{Eq. (10)}$$

The junction field $E_{zj}$ is given as follows:

$$E_{zj} = \frac{2q}{\epsilon_x} V_{CEA} N_A \left(1 - \frac{Z}{W}\right) \qquad \text{Eq. (11)}$$

Equation (11) holds where $N_D$ is much, much greater than $N_A$ and Z lies within the range bounded by o and W where W is the length of the depletion region within the base material.

Since the length of the ionization interval $Z_a$ is much smaller than the depletion W in the base region, equation (11) reduces to the following.

$$E_{zj} = \frac{2q}{\epsilon_s} V_{cEA} N_A \qquad \text{Eq. (12)}$$

The thin oxide field at the collector base junction may be analyzed as follows. It is a complicated function. The exact solution is not known and should include the effects of transporting excess majority carriers through the space charge region. It is assumed that the Z directed field within confines $W_o$ of the thin oxide region, FIG. 8A, is at most a function of Y. The thin oxide field component is represented by the following equation:

$$E_{zox}(y) = \frac{V_{CEA}(Y/T_{ox})}{KT_{ox}} \qquad \text{Eq. (13)}$$

where $$K = \epsilon_{Si}/\epsilon_{SiO_2} \approx 3 \qquad \text{Eq. (14)}$$

The sum of the two field components represents the total electric field leading to ionization in the avalanche area in question. This is given as follows:

$$E_z(y) \approx \sqrt{\frac{2q}{\epsilon_s} V_{CEA} N_A} + \frac{V_{CEA}(Y/T_{ox})}{KT_{ox}} \qquad \text{Eq. (15)}$$

It is clear from Eq. (15) that the z directed field within the confines $W_o$ of the thin oxide region 6 is at most a function of Y given a fixed configuration with a given oxide thickness.

Considering Eq. (8) again, the x directed restraining force then becomes the following.

$$F_{RX} = \tfrac{1}{2}\epsilon_s Z_a \left[ \int_0^y \frac{2q}{\epsilon_s} V_{CEA} N_A\, dy \right.$$
$$+ \int_0^y 2\sqrt{\frac{2q}{\epsilon_s} V_{CEA} N_A}\, \frac{V_{CEA}(Y/T_{ox})}{KT_{ox}}\, dY$$
$$\left. + \int_0^y \left(\frac{V_{CEA}(Y/T_{ox})}{KT_{ox}}\right)^2 dY \right] \qquad \text{Eq. (16)}$$

The solution given for Eq. (16) will consider only the first term since the contributions to the second and third terms can be dismissed from consideration here in order to simplify the analysis.

The solution also assumes breakdown voltage $V_{CEA}$ is a function of avalanche area depth such that $V_{CEA} = Y/Y_o V_{CEAo}$. This assumed dependence can be demonstrated from the condition.

$$dV_{CEA}/dB = \frac{V_{CEA}}{Y}(dy/dB)$$

Given a thin oxide layer 6 of approximately 1000 Angstrom units in thickness or more, the base material resistivities less than 5 Ohm centimeters, the contributions of the second and third terms in equation (16) introduce only second order effects which may be of minimal importance.

Considering only the first term then in Eq. (16) the ionization force in the X direction becomes the following:

$$F_X \approx q V_{CEA} N_A Y Z_a/2 \qquad \text{Eq. (17)}$$

The Lorentz force acting on the ionization volume can also be derived from first principles.

Figure 8E:
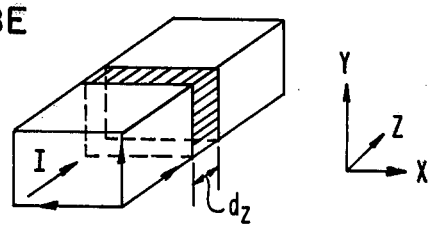
FIG. 8E shows a conductor conducting current I and is considered to be analogous to current flowing in the avalanche volume with length $Z_a$.

Recalling the simple situation of a conductor carrying a current I is illustrated in FIG. 8E. In FIG. 8E, the differential Lorentz force is given by equation (17).

$$dF = Id\vec{z} \times B \qquad \text{Eq. (18)}$$

The conductor shown in FIG. 8E is considered to be analogous to current flowing in the avalanche volume with length $Z_a$.

The total X directed Lorentz force directed within an ionization volume at a length $Z_a$ is given as follows:

$$F_{LX} = \int_0^{Z_a} I_{az} B_y\, dz = I_{az} B_y Z_a \qquad \text{Eq. (19)}$$

Equation (19) is uniquely simple. The total magnetic component of the Lorentz force is specified in terms of the total avalanche current $I_{az}$. It is not necessary to know the details of the nonuniform current density flowing in the ionization region created by the exponential field dependence of election and hole ionization rates.

The differential force acting on the ionization region constitutes magnetic equilibrium. This balance condition is obtained by equating (19) with a total derivative of (17). The total derivative of (17) is given below:

$$dF_x = \frac{\partial F_x}{\partial V_{CEA}} dV_{CEA} + \frac{\partial F_x}{\partial Y_o} + \frac{\partial F_x}{\partial Z_a} dZ_a \quad \text{Eq. (20)}$$

Evaluating the partial derivatives and then collecting terms gives:

$$dF_x = q \frac{N_A Y_o Z_a dV_{CEA}}{2}\left(1 + \frac{V_{CEA}}{Y_o}\frac{dY_o}{dV_{CEA}} + \frac{V_{CEA}}{Z_a}\frac{dZ_a}{dV_{CEA}}\right) \quad \text{Eq. (21)}$$

It can be shown that the following differential equation satisfies (21) in such a way that the last two terms cancel one another.

$$\frac{dY_o}{dB_y} = -\frac{Y_o}{Z_a}\frac{dZ_a}{dB_y} \quad \text{Eq. (22)}$$

It is apparent from (22) that both dimension $Y_o$ and $Z_a$ are modulated by a properly oriented magnetic field. It is shown subsequently that modulation of the ionization depth $Y_o$ is the dominant transduction mechanism.

Equation (21) reduces to the following in view of (22).

$$dF_x = qN_A Y_o Z_a dV_{CEA} \quad \text{Eq. (23)}$$

Equating (23) to (19) describes the potential equilibrium condition:

$$qN_A Y_o Z_a dV_{CEA} = \pm 2I_{az}B_y Z_a \quad \text{Eq. (24)}$$

Solving (24) for $dV_{CEA}$ gives:

$$\Delta V_{CEA} = \pm 2\frac{I_{az}B_y}{qN_A Y_o} \quad \text{Eq. (25)}$$

Figure 10:
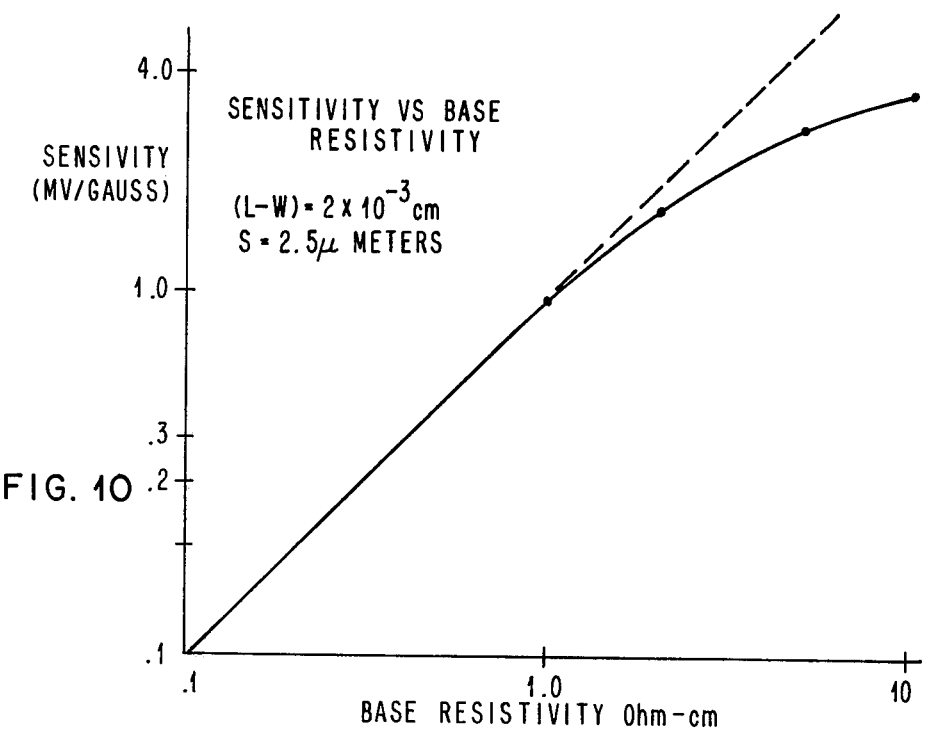
FIG. 10 illustrates the effect of sensitivity as a function of base resistivity for devices according to the embodiment shown in FIG. 1.

Equation (25) describes a differential voltage which appears at each collector. The device is normally operated in a differential mode. An expression for differential output voltage $D_{dif}$ measured between collectors FIG. 10 is obtained by multiplying (25) by a factor of 2.

$$V_{dif} = \pm 4\frac{I_{az}B_y}{qN_A Y_o} \quad \text{Eq. (26)}$$

It is evident from (26) that the factor $B_y/qN_A Y_o$ has the dimensions of ohms. This factor represents a positive or negative resistance, and describes the differential magnetoresistive effect.

Based on the unique vertical V-I property of a "compensated" structure, FIG. 10, the potential of each collector can be described in the following manner.

$$V_{CEA} = V_{CEAo} \pm 2\frac{I_{az}B_y}{qN_A Y_o} \quad \text{Eq. (27)}$$

Given the simplifying assumptions made in connection with (16), it is apparent from (26) that the output signal is linear in $B_y$ and is independent of the length $Z_a$ of the ionization region and independent of the avalanche collector voltage $V_{CEAo}$. The response signal behaves inversely with acceptor concentration $N_a$ within the base region and the steady stage depth $Y_o$ of the ionization region. This dependence on acceptor concentration has been observed experimentally and shown in FIG. 12. It is also apparent that high sensitivity is achieved by making $Y_o$ small and $X_o$ comparatively large. This dimensional criteria is accomplished by use of the thin oxide ionizaton promoter region shown in FIG. 8A.

The quiescent depth $Y_o$ of the ionization region is evaluated from (24) as follows:

Given: 
$B = 10^{-8}$ Webers/cm$^2$/gauss
$I = 4 \times 10^{-3}$ amps
$Q = 1.6 \times 10^{-19}$ coulombs
$N_a = 2.5 \times 10^{15}$ cm$^{-3}$ (5 ohm-cm)
$V_{dif} = 5 \times 10^{-3}$ volts/gauss
$Y_o = 8 \times 10^{-5}$ cm The depth of the collector diffusions was varied experimentally within the range of 8000 Å to 30,000 Å. Device sensitivity was essentially constant throughout this range. This result suggests that the quiescent depth of the ionization region was less than 8000 Å and, therefore, the estimate of 8000 Å appears quite reasonable.

The total expression for the Lorentz restraining force must include an electric field term and is usually written for a single particle in the following functional form:

$$\vec{Fl} = q(\vec{E} + \vec{V} \times \vec{B})$$

Considering all of the z directed carriers moving in the ionization region;

$$Flx = Frxo + Fmx \quad \text{Eq. (28)}$$

Rewriting this expression in view of (19) gives;

$$Flx = Frxo \pm I_{az}B_y Z_a \quad \text{Eq. (29)}$$

The term Frxo is the quiescent Lorentz restraining force acting on the ionization region.

Equation (17) with the total Lorentz restraining force (29) gives;

$$\tfrac{1}{2}qV_{CEA}N_A Y_o Z_a = Frxo \pm B_y Z_a I_{az} \quad \text{Eq. (30)}$$

MAGNETIC MODULATION OF AVALANCHE AREA

The magnetic transduction mechanism operating within this new device allows differential magnetoresistive sensors to be constructed which have very small sensitive areas coupled with very high transduction efficiencies and broad bandwidth capabilities.

The following analysis supports the notion that the fundamental magnetic transduction mechanism of this new device corresponds to modulating avalanche area by means of a properly oriented magnetic field.

An expression for ionization depth Y can be approximated from (30) by solving for $Y_o$ giving:

$$Y_o = Y \pm 2B_y I_{az}/qV_{CEAo}N_a \quad \text{Eq. (31)}$$

Subtracting Y from both sides of (31) gives:

$$Y_o - Y = \pm 2B_y I_{az}/qV_{CEA_o}N_a \quad \text{Eq. (32)}$$

Evaluating (32) for the same conditions given above, shows that a small deflection in the Y dimension occurs and is typically 0.33 A per gauss, where $V_{CEA_o}$ is 30 volts. It is evident from (32) that the amount of deflection is directly proportional to the product of current and magnetic field and is inversely proportional to breakdown voltage $V_{CEA_o}$ and the acceptor concentration $N_a$ of the base region. The deflection distance per gauss computed from (32) is typical of Lorentz carrier deflection within other non-avalanching solid-state sensors such as Hall cells. However, the quiescent depth $Y_o$ of the ionization region of the new device is typically a factor of $10^3$ less than channel dimensions of small Hall cells. For reasonable and typical field values, the transduction efficiency of the avalanche device is high compared to other sensor technology.

An expression for transduction efficiency occurring at each collector can be obtained by dividing (32) by the quiescent depth $Y_o$ of the ionizaton region.

Transduction Efficiency $TE = (Y - Y_o)/Y_o$ $$TE = \frac{2 I_{az} B_y}{q V_{CEA_o} N_A Y_o} \quad \text{Eq. (33)}$$

Equation (33) can be further simplified in view of (26) giving:

$$TE = V_{dif}/2V_{CEA_o} \quad \text{Eq. (34)}$$

For example, a transduction efficiency of 10% can occur at each collector given $V_{dif} = \pm$ volts. This differential signal can be obtained by subjecting the device to a field intensity of approximately ±2000 gauss. Differential transduction efficiency is twice that calculated by (34) for each collector.

It is apparent that the output signal is linear in response to Y directed magnetic fields and is independent of the depth $Z_A$ of the ionization region and independent of the avalanche collector breakdown voltage itself $V_{CEA}$. The response signal depends inversely on the acceptor concentration with the base region. This dependence has been observed experimentally and is clearly shown by FIG. 10.

It is also apparent that the high sensitivities achieved by making the initial depth in the Y direction of the avalanched area at the collector base junction small and the X component comparatively large. That is, a relatively wide thin avalanche area at the face of the collectors at the collector base junction is desired.

This may be accomplished by the use of the thin oxide layer 6 which, together with the overlying electrode 5 creates an ionization promoter region as shown in FIG. 8A and in the other figures.

Equation (26) may be evaluated as follows given $B = 10^{-8}$ webers per square centimeter per gauss, I is $4 \times 10^{-3}$ amps, q is $1.6 \times 10^{-19}$ coloumbs $N_A$ is $2.5 \times 10^{15}$ per cubic centimeter for 5 ohm centimeter substrate material and $Y_o$ is $8 \times 10^{-5}$ centimeters (approximately 8000 Angstrom units). From which the differential output voltage calculator will be $5 \times 10^{-3}$ volts per gauss.

This predicted sensitivity agrees extremely well with that measured from typical devices made from 5 ohm centimeter P-type substrates.

It appears that the new transduction mechanism found is an extremely exciting one. It not only allows magnetic sensors to be constructed which have very small sensitive areas and very high transduction efficiencies and broad bandwidths, but it also demonstrates that the fundamental transduction mechanism of these devices corresponds to one of modulating the avalanche area by means of a properly oriented magnetic field.

As shown above, the magnetic transduction mechanism operative within the device characterized as these new avalanche transistor structures is essentially one of modulating the ionization area at the collector base junctions by means of a magnetic field. The depth of the avalanche region is typically 100 Angstrom units and therefore, at least one dimension of the sensor is extremely tiny. The other dimensions of the ionization area are typically less than two microns in extent and may be jointly used to control the device in such a manner as to make it sensitive only to uniaxially directed field components.

SENSITIVITY AND SUBSTRATE RESISTIVITY

Referring to FIG. 8B, two identical load lines are superimposed and have a slope of $-1/R_L$. The point of intersection of these load lines with the V-I property of a typical sensor defines the output terminal voltage at each collector. It thus reflects the effect of modulating an avalanche voltage by means of a magnetic field. Based on the analysis of the transduction mechanism, the magnetic sensitivity will be inversely dependent on acceptor concentration or, in other words, will increase in proportion to base material resistivity levels.

The above considerations have been substantiated experimentally and FIG. 10 is a plot of peak differential signal output voltage which is measured from devices constructed according to the present invention on wafers having different resistivities. Each device was subjected to the same sinusoidal input magnetic test field of $400 \sin(120\pi\tau)$ gauss. It is clear from the data given that the sensitivity varies inversely with acceptor concentrations as predicted. It is of particular interest to note that the maximum differential signal in millivolts per gauss varies in an absolute manner with substrate resistivity. For example, with 2 ohm centimeter substrate resistivity devices exhibiting magnetic sensitivity of approximately 2 millivolts per gauss and 0.1 millivolts per gauss respectively result. This linear relationship appears to break down for high substrate resistivities. The terms ignored in Eq. (16) become significant for substrate resistivities greater than 5 Ohm-Cm. The contributions and effects of these terms is complicated and will not be discussed here.

Figure 11A:
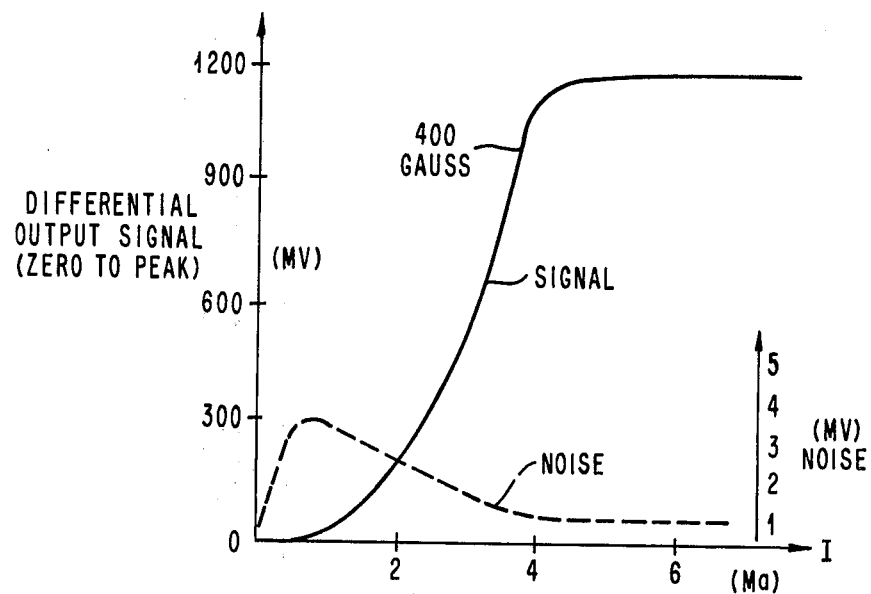
FIG. 11A illustrates the differential voltage output signal between the collectors of a device as shown in FIG. 1 and the noise component in the signal both as a function of collector current.

Each device examined has a signal saturation property that is characteristic of such devices. The saturation effect is illustrated in FIG. 11A where the differential magnetic signal amplitude and noise components are plotted as a function of collector current. The test conditions for the data depicted in FIG. 11A are as follows:

The substrate is 5 ohm centimeter P-type silicon with a (100) orientation. The slit width S is 2.5 micrometers between collectors and the test input field is $400 \sin(120\pi\tau)$ gauss.

Figure 11B:
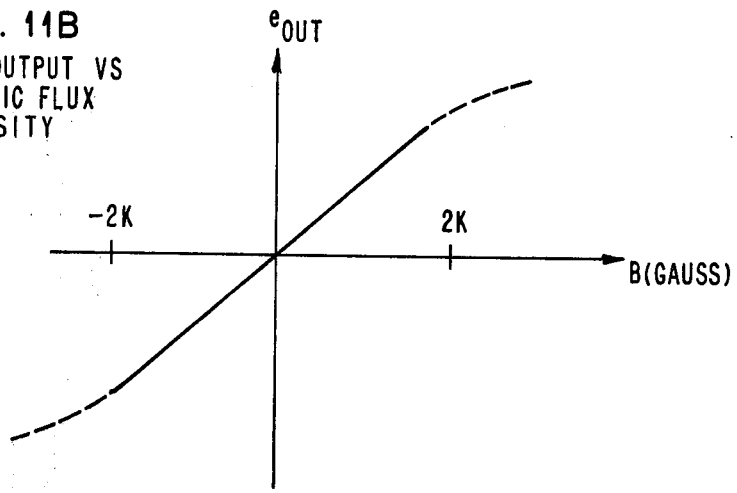
FIG. 11B illustrates the bidirectionally linear region of the sensor output as a function of magnetic field strength.

The increase in the magnetic signal with collector current is shown to saturate at approximately 4 milliamps. The saturation effect has been found to be independent of the substrate resistivity for a range investigated of 0.1 ohm centimeters to approximately 10 ohm centimeters substrate resistivity. It has been observed, however, that the collector current at which saturation occurs will increase inversely with substrate resistivity. The data suggests that the maximum carrier density $\Delta P$ of approximately 30% of the acceptor concentration $N_A$ may be created by the avalanche process in the vicinity of the collector tips. Correspondingly, the length of the space charge region predicted to extend from the function will grow by about 145% of its threshold value. This will demand collector currents in excess of that indicated by signal saturation and will force ionization area to spread. In effect, this action forces the depth of ionization $Y_o$ to grow directly with current above a critical current value. This current saturation property is not to be confused with linear magnetic signal behavior. Magnetic signal linearity will prevail as shown in FIG. 11B despite the fact that devices may be operated in the saturation region.

Figure 12:
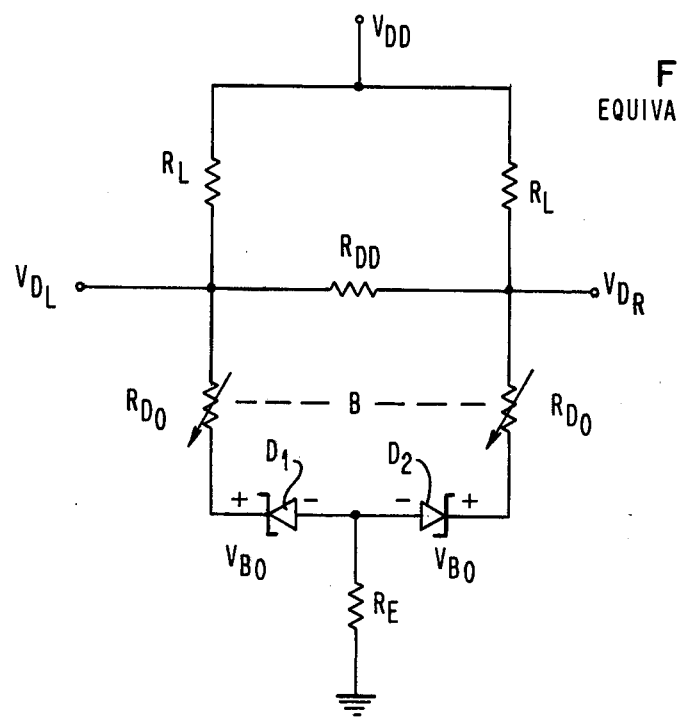
FIG. 12 illustrates an equivalent D.C. circuit for sensors built according to the embodiment described with respect to FIG. 1.

For purposes of understanding the device, an equivalent D.C. electrical circuit for a dual collector device is shown in FIG. 12. The collector to collector ionization resistance $R_{DD}$ is typically 600 ohms. It is measured by shunting the two collectors with an external resistor. The internal resistance is obtained when the external resistance is adjusted until 50% of the unshunted magnetic response signal is obtained.

It is apparent that the proved results obtainable from devices of this class require a compensated avalanche transistor mechanism which will maintain its characteristic vertical volt amp curve over a substantial range. The basic volt amp characteristics are typical open base interactive junction avalanche devices can be described by the following one-dimensional interactive junction analysis.

$$I = \frac{MI'_{co}}{1 - \alpha \cdot M} + \frac{I_{co}}{1 - \alpha} \qquad \text{Eq. (35)}$$

where:
$M = mA_A$ $$M \cdot \alpha = 1 - \left(\frac{V_{CEA}}{V_{CB_o}}\right) N \qquad \text{Eq. (36)}$$

$$V_{CEA} = V_{CEA_o} + (R_X + R_{sc}) I \qquad \text{Eq. (37)}$$

$$R_X = -\frac{(M \cdot \alpha) V_{CEA_o}}{N(1 + M \cdot \alpha) I_c} \qquad \text{Eq. (38)}$$

$$I'_{co} = I_{co} \frac{A_A}{A_C} \qquad \text{Eq. (39)}$$

Where:
$V_{CEA_o}$ is the collector to emitter avalanche voltage.
M is the avalanche multiplication factor and can take on a value of 0.
m is the multiplication per unit area avalanched.
$\alpha$ is the transport efficiency factor.
$V_{CB_o}$ is the collector to base avalanche breakdown voltage with the emitter open.
$I_{Co}$ is the base to collector leakage current.
$I'_{Co}$ is the fraction of base to collector leakage current entering the ionization area at each collector; and
$A_A$ is the avalanche area of the collector to base junction.

Equation (35) above can be developed from first principles and the parametric equation (36) is developed subsequently and has been found adequate in combination with equations (35) and (37) to account for a broad range of avalanche device behavior.

Equation (37) describes the voltage appearing between the collector and emitter terminals of an avalanche device and it includes the potential drop across both positive and negative space charge resistance. The negative space charge resistance term in Eq. (38) will be developed below. The positive space charge resistance effect has already been described above is that due to excess majority carriers traversing the collector space charge region. Equation (3) gives the accepted solution for this component of resistance.

The parametric equation (36) was developed using the following arguments.

Consider again the curve C in FIG. 6D. The negative slope of VI property illustrated has been observed in laboratory devices to be substantially linear whenever I is less than $I_A$ where $I_A$ is defined as follows.

The behavior can be described by the following equation.

$$V_{CEA} \simeq V_{CB_o}\left(1 - \frac{(M \cdot \alpha)_o}{N} \frac{I}{I_a}\right) \qquad \text{Eq. (40)}$$

which is true for $I < I_a$ where:
N is an arbitrary scale factor.
$(M \cdot \alpha)_o$ is a finite and arbitrary product of avalanche multiplication M and the transport factor $\alpha$.

If the product $(M \cdot \alpha)_o$ is substantially less than unity, equation (40) can be considered to be an approximation to the following equation (41).

$$\frac{V_{CEA}}{V_{CB_o}} = \left(1 - (M \cdot \alpha)_o \frac{I}{I_a}\right)^{1/N} \qquad \text{Eq. (41)}$$

Solving Equation (41) for the minus term within the parentheses, in terms of the collector to emitter avalanche voltage versus the collector to base with emitter open voltage, gives the following:

$$(M \cdot \alpha)_o \frac{I}{I_a} = 1 - \left(\frac{V_{CEA}}{V_{CB_o}}\right) N \qquad \text{Eq. (42)}$$

The term on the left in Eq. (42) is a special case of a more general factor $M(V,I) \cdot \alpha(V, I)$. Under the circumstances given, equation (42) reduces to equation (39) above. The special condition required that $(M \cdot \alpha)_o$ is substantially less than unity and that this quantity multiplied by $I/I_a$ can be realized in interactive junction devices by incorporating the resistive connection between the emitter contact 3 and the injector 2 as shown by region 4 in FIG. 2.

Equation (38) can be obtained from equations (35) and (36) by solving the following differential equation.

$$\frac{dI_c}{dV} = \frac{\partial I_c}{\partial m} \frac{dm}{dv}\bigg|_{\alpha = K} + \frac{\partial I_c}{\partial \alpha} \frac{d\alpha}{dV}\bigg|_{M = K} \qquad \text{Eq. (43)}$$

The appropriate solutions for the derivative terms in equation (43) are listed below.

$$\frac{\partial I_c}{\partial m} = \frac{I_{co}}{(1 - \alpha m)^2} \qquad \text{Eq. (44)}$$

$$\frac{\partial I_c}{\partial \alpha} = \frac{MI}{1 - \alpha M} \qquad \text{Eq. (45)}$$

-continued $$\frac{dM}{dV} d = K = -\frac{N(1-\alpha M)}{\alpha V} \quad \text{Eq. (46A)}$$

$$\frac{d\alpha}{dV} M = K = -\frac{N(1-\alpha M)}{MV} \quad \text{Eq. (46B)}$$

Substituting 44 through 46B into equation (43) and rearranging and inverting gives the following:

$$\frac{dV}{dI} = R_X = -\frac{(M \cdot \alpha) V_{CEA}}{N(1 + M \cdot \alpha) I_C} \quad \text{Eq. (47)}$$

Equation (47) is an expression which describes the negative collector space charge resistance in terms of the product M·α. It applies for interactive junction devices. This expression for the negative resistance term has been developed from a different point of view than that given earlier for deriving the negative resistance term. To simplify the subsequent analysis, it is convenient to use the first order expansion of equation (47) which yields equation (48) as follows.

$$R_{Xmax} \approx -\frac{(M \cdot \alpha) V_{CEA_o}}{NI_c} (1 - \alpha \cdot M) \quad \text{Eq. (48)}$$

The following analysis sections will consider various avalanche device behaviors where the collector voltage $V_{CEA}$ at avalanche is close to the threshold value $V_{CEA_o}$ observed for the collector to emitter breakdown. Under these circumstances, the voltage $V_{CEA}$ in equation (47) may be changed to $V_{CEA_o}$ with little loss in predicting the general behavior. The approximation given changes the meaning of the negative resistance to correspond to the maximum value as given above in its truncated form as Eq. (48).

Conventional interactive junction devices may be described as having an M·α product which, in general, increases in some non-linear manner with current from an essentially zero value to some finite value less than unity. It will be shown that if and only if the M·α increases with current can a net negative collect resistance exist. The increasing behavior of the product M·α as created in the present devices is a direct result of the current dependent injection criteria of the PN junction formed between the injector and the base region.

In contrast, a diode structure does not have a PN junction at the emissive or injecting end of the structure. For this reason, one usually does not classify a diode as an interactive junction device. However, such a structure never exhibits a negative resistance and can be characterized by an equivalent injection efficiency which is constant independent of current and by having a product M·$\alpha_d$ which is constant also and is essentially independent of current.

Before discussing this specific interactive junction devices, Equation (37) will be used to describe the behavior of an isolated PN junction. The behavior corresponds to that of a diode. The avalanche volt amp characteristics of such a device can be described by considering the interactive equations given that the product M·$\alpha_d$ is constant and less than unity. This analysis leads to the voltage $V_{CB_o}$ defined as the emitter open collector to base breakdown voltage which is characteristic of an interactive junction device. The following examples demonstrate the use of equations (35) through (38).

For a diode device $R_x$ in equation (38) is given as follows.

$$R_x = -\frac{(M \cdot \alpha)_d V_{CB_o}'}{NI(1 + (M \cdot \alpha)_d)} \quad \text{Eq. (49)}$$

Substituting Eq. (49) into a more general form of Eq. (37) gives the following.

$$V = V_{CB_o}'\left(1 - \frac{(M \cdot \alpha)_d}{N(1 + (M \cdot \alpha)_d)}\right) + R_{sc}I \quad \text{Eq. (50)}$$

The diode breakdown voltage given by Eq. (50) can be rewritten in terms of $V_{CB_o}$, the interactive junction emitter open breakdown voltage definition. This is given and follows:

$$V = V_{CB_o} + R_{sc}I \quad \text{Eq. (51)}$$

where:

$$V_{CB_o} = V_{CB_o}'\left(1 - \frac{(M \cdot \alpha)_d}{N(1 + (M \cdot \alpha)_d)}\right) \quad \text{Eq. (52)}$$

and where:

$V_{CB_o}$ is the maximum junction breakdown voltage given an M·$\alpha_d$ of 0 and M·$\alpha_d$ is the Mα product applicable for diodes $R_{SC}$ is the space charge resistance given by Equation (1).

The VI plot for a diode device is shown in FIG. 5A. The value of the positive diode resistance $R_{SC}$ can be controlled by the avalanche area involved and by the resistivity of the base material.

Interactive junction snap back VI characteristic devices were considered in my previously identified copending patent application. The application of the analysis above to these devices is given next.

Consider a simple interactive junction device. Assume that the product M·α may abruptly reach a constant value less than unity at low values of avalanche collector current and then remain at a constant value independent of current. For this simple situation, equation (37) becomes the following:

$$V_{CEA} = V_{CEA_o}\left(1 - \frac{M \cdot \alpha}{N(1 + M \cdot \alpha)}\right) + I R_{SC} \quad \text{Eq. (53)}$$

It is convenient to specify a value of $V_{CEA}$ as follows.

$$V_{CEA} = V_{CEA_o}\left(1 - \frac{M \cdot \alpha}{N(1 + M \cdot \alpha)}\right) \quad \text{Eq. (54)}$$

Figure 14:
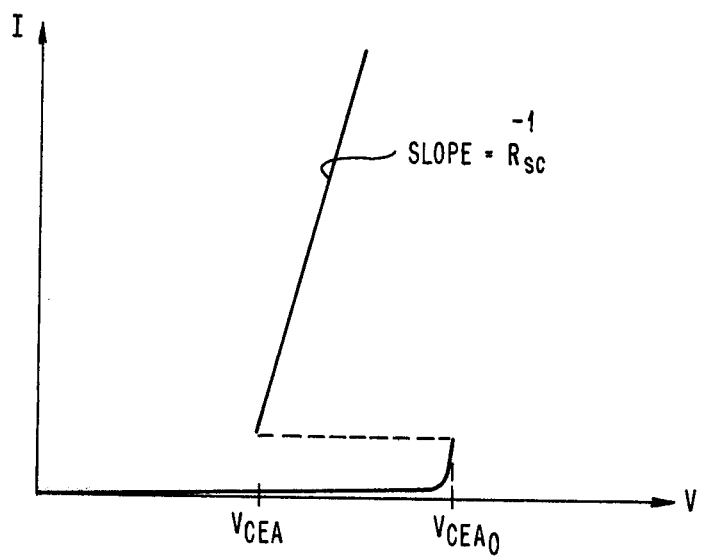
FIG. 14 illustrates the V-I property of an avalanche device when the product M·α abruptly increases to a constant value.

The avalanche VI properties corresponding to this situation is shown in FIG. 14. The so-called snap back effect as shown in FIG. 14 is due to the abrupt increase in the product M·α at low values of collector current.

Turning now to the compensated interactive junction devices characteristic of the present invention, we will consider what the V-I avalanche properties would be if the product M·α could be caused to vary linearly for a broad range of current as is the case with the present devices.

Figure 15:
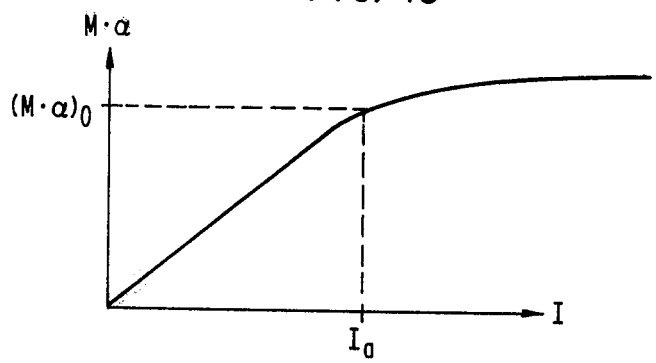
FIG. 15 illustrates the product M·α increases linearly with current for current values less than a critical value.

Assume that the product M·α may vary in accordance with the collector current as illustrated in FIG. 15, where the assumption is made that the product M·α is approximately equal to the quantity $M \cdot \alpha_o \times I/I_a$ for $I < I_a$. Further, we will assume that $(M \cdot \alpha)_o$ is less than 1 and is typically in the range of 0.2 and that I is much less than $I_a$. Given these circumstances, equation (48) reduces to:

$$R_x \approx -\frac{(M \cdot \alpha)_o V_{CEAo}}{NI_a}\left(1 - (M \cdot \alpha)_o \frac{I}{I_a}\right) \qquad \text{Eq. (55)}$$

Substituting equation (55) into equation (37), yields the following expression for the collector voltage.

$$V_{CEA} = \qquad \text{Eq. (56)}$$
$$V_{CEAo} + I\left(R_{sc} - \frac{(M \cdot \alpha)_o V_{CEAo}}{NI_a}\right) + \left(\frac{(M \cdot \alpha)_o I}{I_a}\right)^2 \frac{V_{CEAo}}{N}$$

For the condition that $I < I_a$, equation (57) results:

$$\left(\frac{I}{I_a}(M \cdot \alpha)\right)^2 \frac{V_{CEAo}}{N} << V_{CEAo} \qquad \text{Eq. (57)}$$

Figure 16:
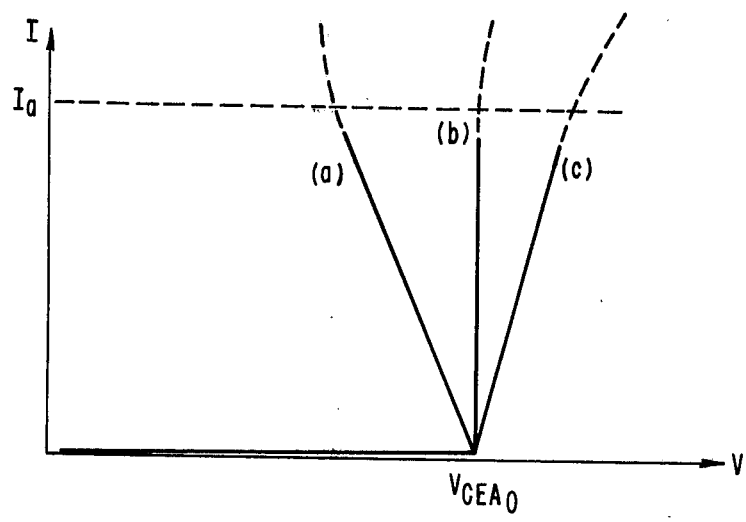
FIG. 16 illustrates the V-I property of an avalanche device for a range of net collector space charge resistances.

FIG. 16 illustrates a range of device behavior given the foregoing circumstances.

It is apparent from FIG. 16 that curve B depicts a very special VI property where the net collector resistance of the avalanche device is essentially zero over the substantial current range. The situation occurs whenever the following resistance equality is satisfied.

$$R_{sc} = \frac{(M \cdot \alpha)_o V_{CEAo}}{NI_a} \qquad \text{Eq. (58)}$$

The positive collector space charge resistance is defined in terms of $V_{CEAo}$, the acceptor concentration $N_A$, the avalanche area A and the carrier saturation velocity $V_S$. Substituting these as given by the expression for space charge resistance $R_{sc}$ into equation 58 and rearranging, yields the following:

$$\frac{(M \cdot \alpha)_o}{I_a} = \frac{N}{q N_A A_A V_s} \qquad \text{Eq. (59)}$$

It is evident that the ratio on the left in equation (59) is a constant and depends upon device parameters that can be varied such as the avalanche area and the substrate or base resistivity. Satisfaction of this criteria is desired in order to optimize the design of dual collector magnetic sensor avalanche transistors.

The resistivities and aspect ratio of the resistive connector between the emitter contact and the injector which is shown by region 4 in FIG. 1 may be adjusted during device manufacture and provides a versatile means for allowing the product M·α to increase linearly with collector current to achieve tne vertical VI property illustrated in the figures. The critical value of the resistance of this region 4 depends upon the promoter geometry at the thin oxide 6, the substrate or base resistivity and the length of the transport and recombination region 7.

Figure 17:
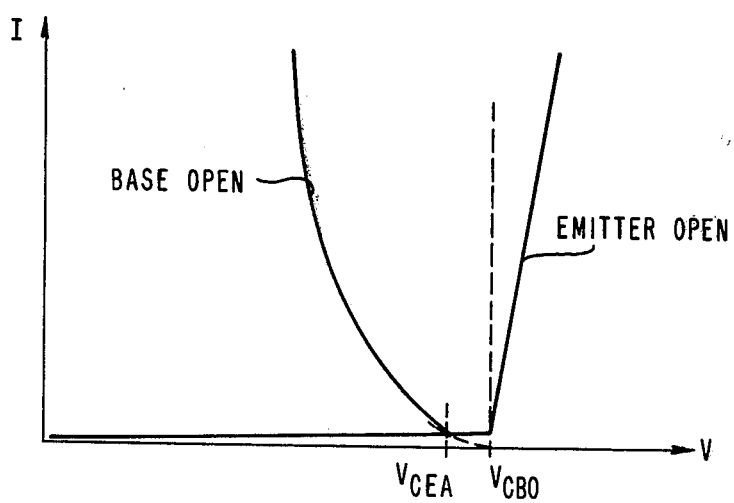
FIG. 17 illustrates the V-I properties typical of open base and open emitter transistors.

Considering the effects of an uncompensated interactive junction device the most common avalanche collector VI behavior encountered for conventional lateral interactive junctions is illustrated in FIG. 17.

As shown in FIG. 17, a typical positive space charge resistance will be dominated by negative resistance effects and the product M·α will increase in non-linear fashion and attain a value of approximately 0.8 or greater at high current levels. This uncontrolled behavior accounts for the non-linear negative resistance shown with the base open designation in FIG. 17. Devices such as these are characterized by a simple emitter diffusion which is devoid of any injection efficiency control such as those incorporated in FIGS. 1 and 2.

The preceding analysis demonstrates that the negative collector resistance is obtained if the product M·α is not constant, and will increase with current to a value less than unity. Linear negative resistance can only be obtained if the product M·α is caused to increase directly with current. A nearly zero collector avalanche resistance can be achieved throughout a finite current range when both positive and negative space charge resistance effects cancel one another. This condition is the critical device compensation necessary for the best performance of the invention as described.

Having thus described my invention with reference to a particular embodiment thereof, what I wish to protect by Letters Patent is:

1. A stabilized magnetically sensitive avalanche transistor having a base region of first conductivity type material and spaced emitter and collector regions of second conductivity type material forming respective PN junctions with said base region, said emitter and collector regions being connected to a source of electrical potential of proper polarity and magnitude to forward bias the emitter base junction and to reverse bias the collector base junction into avalanche generation of excess majority and minority carriers in said base region, said collector collecting said minority carriers, a region of second conductivity type forming an injector of minority carriers in said base region and a region of second conductivity type having a higher resistivity than said emitter region and said injector region extending from said emitter region to said injector region in the direction toward said collector region, said region of second conductivity type separating said emitter region from said injector region and from said base region only at a portion of said emitter base junction facing said collector base junction, there being at least two of said collector regions spaced apart from one another in said base material and approximately equidistant from said injector region, a localized impact ionization promotor means for facilitating the creation of an area of local covalent bond ruptures in the portion of the total area of said collector base junctions lying closest to said emitter, said promotor means affecting a portion of said area which is smaller than the total portion thereof lying closest to said emitter, said promotor means extending from said collector base junction area toward said emitter and serving to increase the local energy density in said smaller area to produce, upon supply to said area of said minority carriers from said injector, an abruptly conducting avalanche current generation of excess minority and majority carriers in an M factored multiplication process occurring at a characteristic voltage applied between said emitter and collector contacts.

2. A transistor as described in claim 1, wherein:
said injector means is located approximately one or more diffusion lengths for minority carriers in said base material away from said emitter and said injector means is located approximately one majority carrier diffusion length for majority carriers in said base material away from said collectors.

3. A transistor as described in claim 1 or claim 2, wherein:
said injector has an injection efficiency of approximately ½ and the product of said M factor in said multiplication and the transportation efficiency of said material is ½ or less.

4. Apparatus as described in claim 3, wherein:
said emitter and said injector lie on a center line of symmetry in said base material, said two collectors lying on opposite sides of said line of symmetry and approximately equidistant therefrom.

5. Apparatus as described in claim 1 or claim 2, wherein:
said emitter and said injector lie on a center line of symmetry in said base material, said two collectors lying on opposite sides of said line of symmetry and approximately equidistant therefrom.

6. Apparatus as described in claim 1 or 2, wherein:
said injector means is located at least two diffusion lengths for minority carriers in said base material in distance away from said emitter means and approximately one majority carrier diffusion length for majority carriers in said base material away from said collectors.

7. Apparatus as described in claim 3, wherein:
said injector means is located at least two diffusion lengths for minority carriers in said base material in distance away from said emitter means and approximately one majority carrier diffusion length for majority carriers in said base material away from said collectors.

8. Apparatus as described in claim 4, wherein:
said injector means is located at least two diffusion lengths for minority carriers in said base material in distance away from said emitter means and approximately one majority carrier diffusion length for majority carriers in said base material away from said collectors.

9. Apparatus as described in claim 5, wherein:
said injector means is located at least two diffusion lengths for minority carriers in said base material in distance away from said emitter means and approximately one majority carrier diffusion length for majority carriers in said base material away from said collectors.

* * * * *